(12) United States Patent
Kato

(10) Patent No.: US 6,278,145 B1
(45) Date of Patent: *Aug. 21, 2001

(54) PN JUNCTION DIODE HAVING ENHANCED LIGHT-GATHERING EFFICIENCY

(75) Inventor: Hisayuki Kato, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/452,148

(22) Filed: Dec. 1, 1999

(30) Foreign Application Priority Data

Jun. 25, 1999 (JP) .................................................. 11-180440

(51) Int. Cl.[7] ......................... H01L 31/113; H01L 31/06; H01L 31/0232
(52) U.S. Cl. ........................... 257/292; 257/436; 257/461
(58) Field of Search .................................. 257/290, 291, 257/292, 436, 461

(56) References Cited

U.S. PATENT DOCUMENTS 4,719,498 * 1/1988 Wada et al. .

4,885,623 * 12/1989 Holm-Kennedy et al. .

FOREIGN PATENT DOCUMENTS 60-90474  5/1985 (JP) .
4-27162  1/1992 (JP) .

* cited by examiner

*Primary Examiner*—Ngân V. Ngô
(74) *Attorney, Agent, or Firm*—McDermott, Will & Emery

(57) ABSTRACT

A gate oxide film 18 and a gate electrode 20 are formed on a surface of a P-type substrate 14. A concave portion 42 is provided in a region of the P-type substrate 14, the region being contiguous to the gate electrode 20. On the P-type substrate 14, an N-type drain region 30 is disposed on the opposite side of the gate electrode 20 from the concave portion 42. N-type impurities are implanted into the P-type substrate 14 at a predetermined angle relative to the latter, thereby forming an N-type region 44 which includes a region underneath the concave portion 42 and which is partially submerged beneath the gate oxide film 18. P-type impurities are then implanted into the P-type substrate 14 at right angles to the latter, thus forming a P-type region 46 which includes a region underneath the concave portion 42 while covering the N-type region 44 and which forms a PN junction diode in combination with the N-type region 44.

10 Claims, 24 Drawing Sheets

PN JUNCTION DIODE HAVING ENHANCED LIGHT-GATHERING EFFICIENCY

BACKGROUND OF THE INVENTION

1. Field of the Invention

The present invention relates to a semiconductor device and a method of manufacturing the semiconductor device. More particularly, the invention relates to a semiconductor device comprising photo detectors each made of a PN junction diode, as well as to a method of manufacturing such a semiconductor device.

2. Description of the Background Art

As a solid state image sensor for use in video cameras, there exist conventional semiconductor devices using a PN junction diode as a photo detector. FIG. 23 shows a diagram of an equivalent circuit corresponding to one pixel in such a semiconductor device. As shown in FIG. 23, the typical semiconductor device includes per pixel a PN junction diode 10 working as a photo diode, and a control transistor 12 connected serially to the PN junction diode 10.

FIG. 24A is a cross-sectional view of a partial structure corresponding to the equivalent circuit in FIG. 23. FIG. 24B is a plan view of the partial structure corresponding to the equivalent circuit. The conventional semiconductor device comprises a silicon single crystal substrate 14 arranged for use as a P-type semiconductor (simply called the P-type substrate 14 hereunder although including P-type wells formed in an N-type wafer). A surface area of the P-type substrate 14 is divided into single-pixel regions by an isolation oxide film 16.

The P-type substrate 14 is furnished with a gate oxide film 18, a gate electrode 20, and side walls 22 laterally surrounding these elements. On one side of the gate electrode 20 are an N-type region 24 arranged for use as an N-type semiconductor and a P-type region 26 arranged for use as a P-type semiconductor. The N-type region 24 is formed by implanting N-type impurities such as phosphorus (P) or arsenic (As) into the P-type substrate 14 at a predetermined angle relative to the latter, i.e., in such a manner that the N-type impurities reach apart immediately below the gate oxide film 18. After the N-type region 24 is formed, the P-type region 26 is produced by implanting P-type impurities such as boron (B) into the P-type substrate 14 at right angles to the latter. Between the N-type region 24 and the P-type region 26, a PN junction plane 28 is produced.

On the other side of the gate electrode 20 is an LDD (Lightly Doped Drain) structure N-type drain region 30. The N-type drain region 30 is formed by implanting N-type impurities into the P-type substrate 14 in a well-known manner.

In the structure shown in FIGS. 24A and 24B, the N-type region 24 and P-type region 26 constitute a PN junction diode 10 that functions as a photo diode. The gate electrode 20 and N-type drain region 30 make up a control transistor 12 connected to the PN junction diode 10. In operation, light 32 enters the P-type region 26, generating a light signal carrier 34 in the N-type region 24 in a manner proportional to the amount of the incident light 32. The light signal carrier 34 that developed in the N-type region 24 is transferred to the N-type drain region 30 when a predetermined driving voltage is fed to the gate electrode 20.

In the conventional semiconductor device outlined above, an insufficient carrier path that may develop between the PN junction diode 10 and the control transistor 34 prevents the light signal carrier 34 from being adequately transferred from the PN junction diode 10. The result is a so-called afterimage phenomenon. In the structure shown in FIGS. 24A and 24B, a portion formed in a partially submerged manner immediately under the gate oxide film 34 (called the submerged portion hereunder) in the N-type region 24 constitutes the carrier path connecting the PN junction diode 10 to the control transistor 12. To forestall the afterimage phenomenon thus requires providing the submerged portion of the N-type region 24 with a sufficient carrier transfer capability.

In order to confer an adequate carrier transfer capability to the submerged portion of the N-type region 24, it is necessary to implant N-type impurities of a high enough concentration underneath the gate oxide film 18. More specifically, a partially submerged portion containing highly concentrated N-type impurities of a uniform distribution needs to be formed by implanting the impurities into the flat P-type substrate 14 at an angle with respect to the latter.

The trouble is that such a partially submerged portion meeting the above requirements is difficult to form through the use of conventional semiconductor device manufacturing techniques. As a result, conventional semiconductor devices tend to be lacking in the carrier transfer capability of the submerged portions in the N-type region 24 and are thus susceptible to the afterimage phenomenon.

Conventional semiconductor devices offer higher resolutions as the PN junction diode 10 shows a higher sensitivity. The sensitive of the PN junction diode 10 improves as the amount of light incident on the P-type region 26 becomes grater, the area of the PN junction plane 28 becomes wider, and the level of light-gathering efficiency of the P-type region 26 becomes higher.

Conventional semiconductor devices attain higher degrees of integration the narrower the area occupied by the P-type region 26. One known way to enhance the sensitivity of the PN junction diode 10 without increasing the area occupied by the P-type region 26 is by furnishing individual P-type regions 26 with a convex microlens each. The convex microlens condenses diffused light and causes the condensed light to enter the P-type region 26, boosting the sensitivity of the PN junction diode 10. This is an effective technique for maintaining a high degree of integration while attaining a high level of resolution at the same time.

Except for the convex microlens technique, there are few other methods conventionally employed to enhance the sensitivity of the PN junction diode 10 without increasing the area taken up by the P-type region 26. So far, there have not been many in-depth studies on how to enhance the light-gathering efficiency of the P-type region 26 without increasing the area occupied by the PN junction plane 28.

SUMMARY OF THE INVENTION

It is therefore a first object of the present invention to overcome the above and other deficiencies of the prior art and to provide a semiconductor device including a carrier path having a sufficient carrier transfer capability between a PN junction diode and a control transistor, and a method of manufacturing such a semiconductor device.

It is a second object of the present invention to provide a semiconductor device having a wide effective area for a PN junction plane and comprising PN junction diodes offering enhanced light-gathering efficiency, as well as a method of manufacturing such a semiconductor device.

The above objects of the present invention are achieved by a semiconductor device described below. The device includes a PN junction diode and a control transistor. The PN junction diode functions as a photo diode and comprises a semiconductor of a first conduction type that is one of a P- and an N-type and another semiconductor of a second conduction type that is the other of the two types. The control transistor controls transfer of a light signal carrier generated within the PN junction diode. The semiconductor device also includes a first conduction type substrate adjusted for said first conduction type. A gate oxide film and a gate electrode are furnished on a surface of the first conduction type substrate. A concave portion is provided in a region of the first conduction type substrate, which region is contiguous to the gate electrode. A second conduction type drain region is disposed on the opposite side of the gate electrode from the concave portion. A second conduction type region which includes a region underneath the concave portion is provided in the first conduction type substrate in a partially submerged manner underneath the gate oxide film. A first conduction type region which includes a region underneath the concave portion is provided on the first conduction type substrate so as to cover the second conduction type region. The first conduction type region and the second conduction type region together constitutes the PN junction diode.

The above objects of the present invention are also achieved by a manufacturing method of a semiconductor device including a PN junction diode and a control transistor. With regard to the manufacturing method, the PN junction diode functions as a photo diode and includes a semiconductor of a first conduction type that is one of a P- and an N-type and another semiconductor of a second conduction type that is the other of the two types. The control transistor controls transfer of a light signal carrier generated within the PN junction diode. In the manufacturing method, a gate oxide film and a gate electrode are formed on a surface of a first conduction type substrate adjusted for the first conduction type. A concave portion is formed in a region of the first conduction type substrate, which region is contiguous to said gate electrode. On the first conduction type substrate is formed a second conduction type drain region on the opposite side of the gate electrode from the concave portion. Second conduction type impurities are implanted into the first conduction type substrate at a first angle relative to the substrate in order to form a second conduction type region which includes a region underneath the concave portion and which is provided in a partially submerged manner underneath the gate oxide film. First conduction type impurities are implanted into the first conduction type substrate at a second angle relative to the substrate in order to form a first conduction type region which includes a region underneath the concave portion and which covers the second conduction type region. The first conduction type region and the second conduction type region together constitutes the PN junction diode.

Other objects and further features of the present invention will be apparent from the following detailed description when read in conjunction with the accompanying drawings.

DESCRIPTION OF THE PREFERRED EMBODIMENTS

Figure 1A:
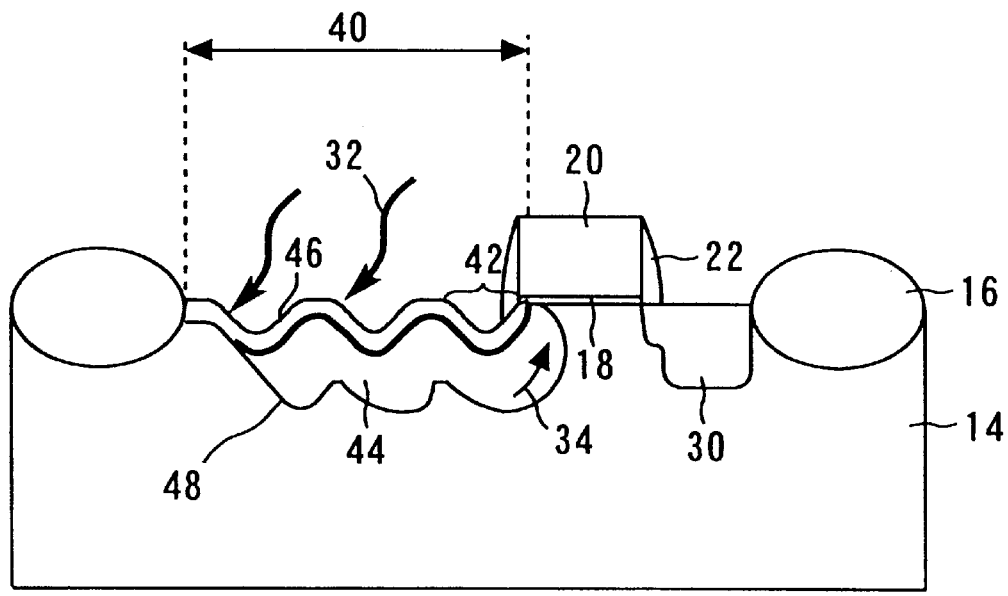
FIG. 1A is a cross-sectional view of a semiconductor device practiced as a first embodiment of the present invention.

Preferred embodiments of the present invention will now be described with reference to the accompanying drawings. Throughout the drawings, like reference characters designate like or corresponding parts, and their descriptions are omitted where they are repetitive.

First Embodiment

Figure 1B:
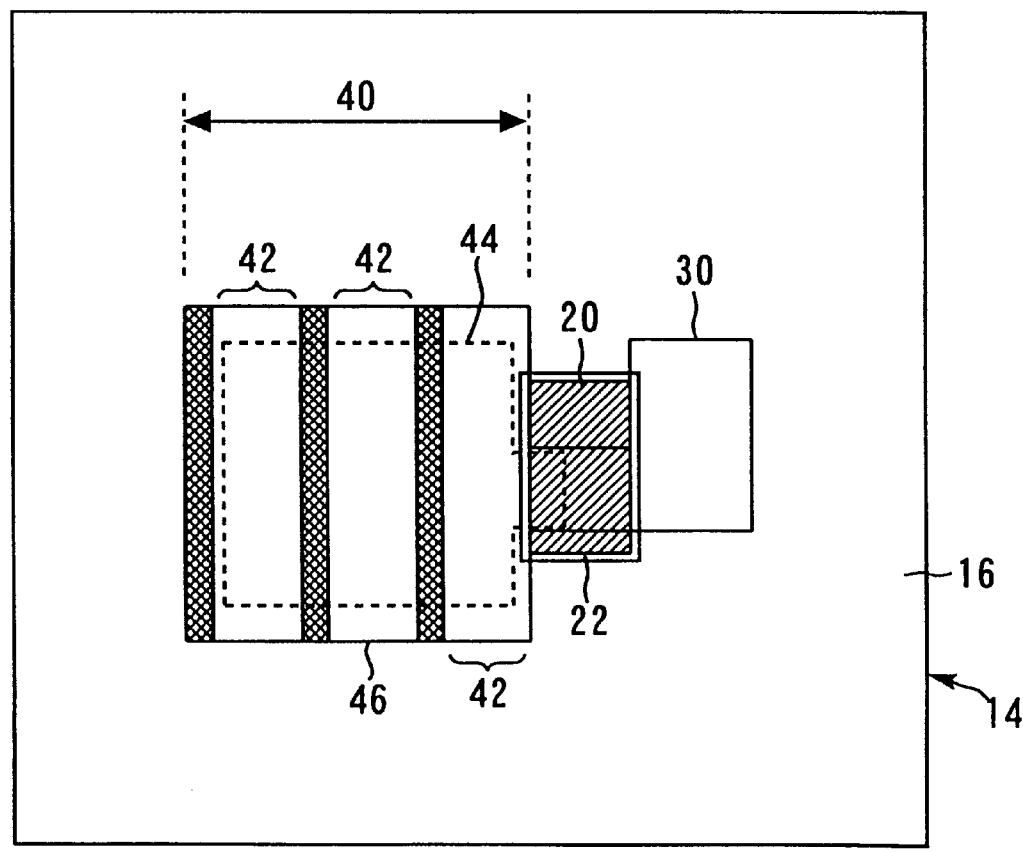
FIG. 1B is a plan view of the semiconductor device as the first embodiment.
Figure 23:
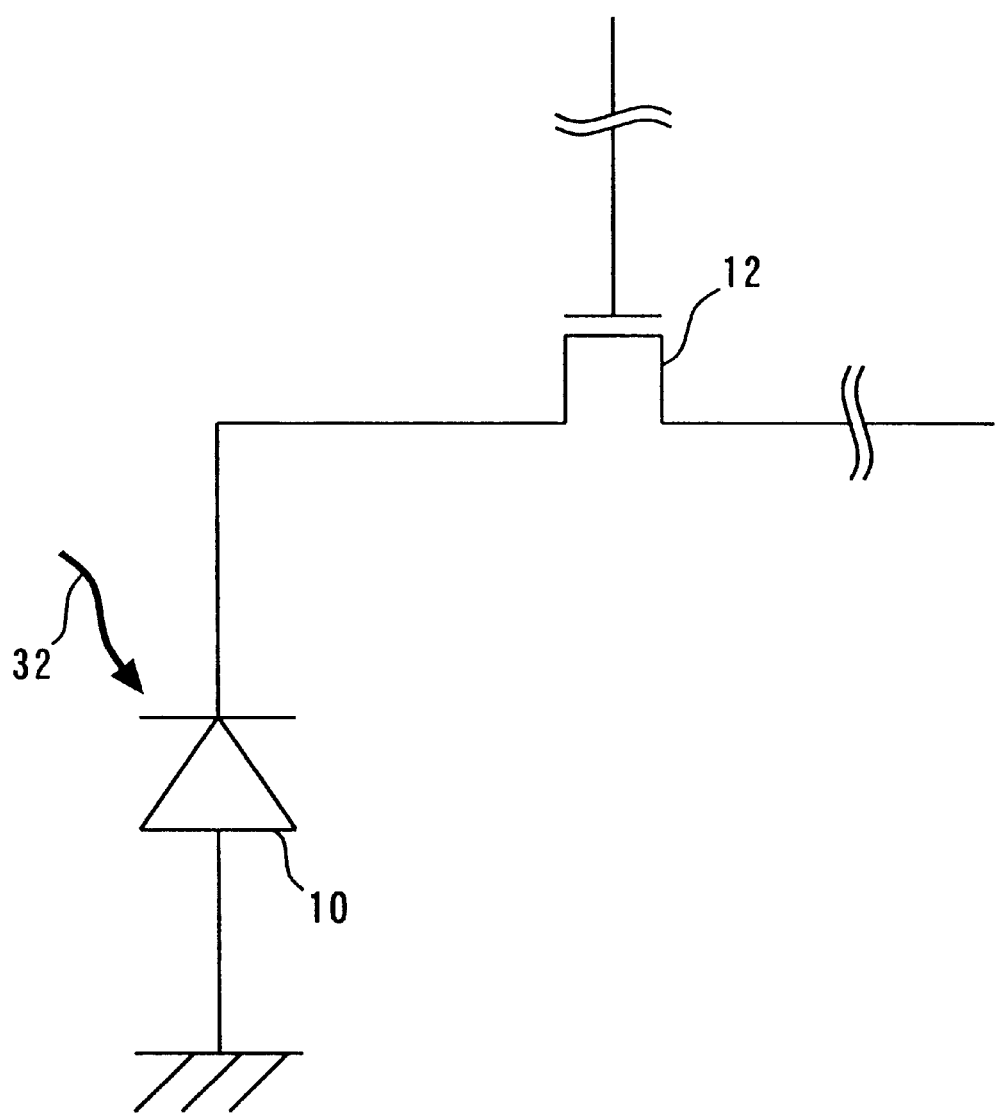
FIG. 23 is a diagram showing an equivalent circuit corresponding to one pixel in a conventional semiconductor device.
Figure 24A:
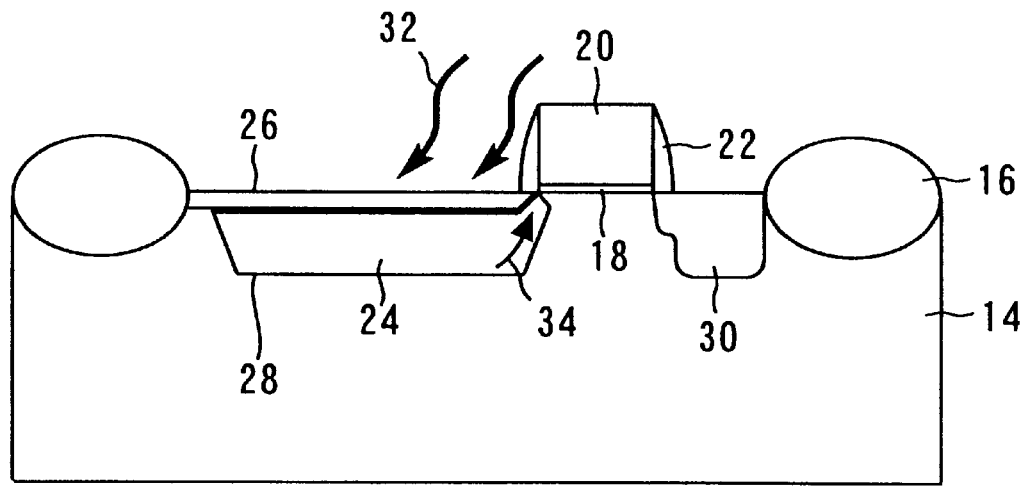
FIG. 24A is a cross-sectional view of the conventional semiconductor device.
Figure 24B:
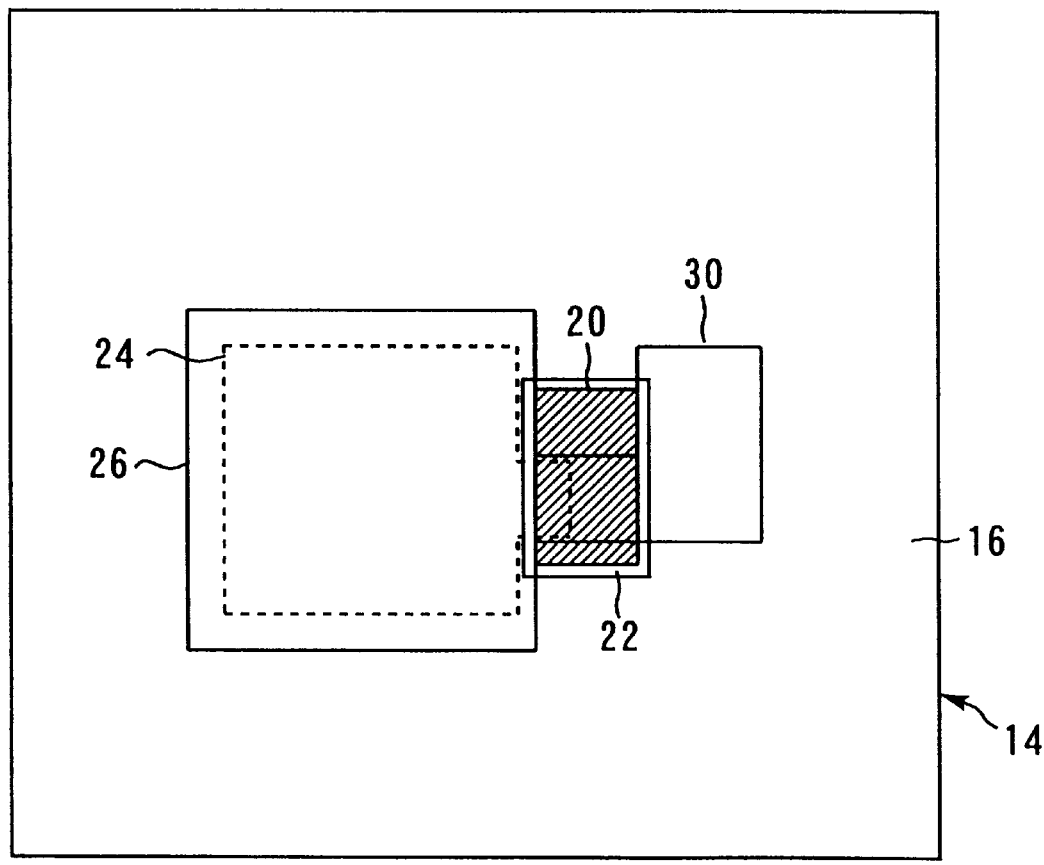
FIG. 24B is a plan view of the conventional semiconductor device.

FIG. 1A is a cross-sectional view of a semiconductor device practiced as a first embodiment of the present invention. FIG. 1B is a plan view of the semiconductor device as the first embodiment. As with the conventional semiconductor device (see FIGS. 23, 24A and 24B), the inventive semiconductor device comprises a PN junction diode 10 and a control transistor 12 per pixel. FIGS. 1A and 1B depict a typical structure of elements constituting a single pixel.

The semiconductor device as the first embodiment has a silicon single crystal substrate 14 arranged for use as a P-type semiconductor (simply called the P-type substrate 14 hereunder although including P-type wells). A surface area of the P-type substrate 14 is divided into single-pixel regions by an isolation oxide film 16. The P-type substrate 14 is furnished with a gate oxide film 18, a gate electrode 20, and side walls 22 laterally surrounding these elements.

On one side of the gate electrode 20, i.e., on the left-hand side thereof as seen in FIG. 1A, is a region where the PN junction diode 10 is to be formed (called the diode region 40 hereunder). The diode region 40 comprises a plurality of groove-like concave portions 42 a part of which is contiguous to the gate electrode 20.

The diode region 40 includes an N-type region 44 arranged for use as an N-type semiconductor, and a P-type region 46 arranged for use as a P-type semiconductor. Between the regions 44 and 46 is a PN junction plane 48. The N-type region 44 is formed by implanting N-type impurities such as phosphorus or arsenic into the P-type substrate 14 at a predetermined angle relative to the latter, i.e., in such a manner that the N-type impurities reach a part immediately below the gate oxide film 18.

After the N-type region 44 is formed, the P-type region 46 is produced by implanting P-type impurities such as boron into the P-type substrate 14 at right angles to the latter. A bottom of the N-type region 44 and a bottom of the P-type region 46 (i.e., PN junction plane 48) are shaped in wavelike fashion following a surface contour of the diode region 40.

On the other side of the gate electrode 20, i.e., on the right-hand side thereof as seen in FIG. 1A, is an LDD structure N-type drain region 30. The N-type drain region 30 is formed by implanting N-type impurities into the P-type substrate 14 in a well-known manner.

In the semiconductor device practiced as the first embodiment, the N-type region 44 and P-type region 46 constitute a PN junction diode 10 that functions as a photo diode. The gate electrode 20 and N-type drain region 30 make up the control transistor 12 connected to the PN junction diode 10. In operation, light 32 enters the diode region 40, generating a light signal carrier 34 in the N-type region 44 in a manner proportional to the amount of the incident light 32. The light signal carrier 34 that developed in the N-type region 44 is transferred to the N-type drain region 30 when a predetermined driving voltage is fed to the gate electrode 20.

Figure 2A:
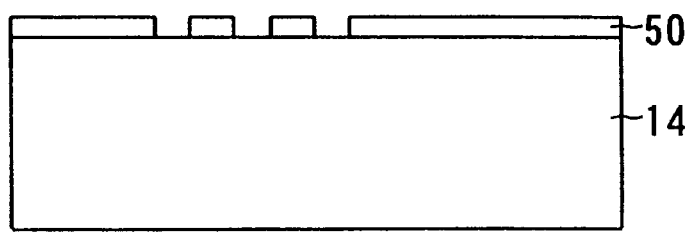
FIGS. 2A to 2E and FIGS. 3A to 3C are cross-sectional views for describing a manufacturing method of the semiconductor device as the first embodiment.

An inventive method of manufacturing the semiconductor device as the first embodiment will now be described with reference to FIGS. 2A through 3C. Initially, a protective film 50 is formed over the P-type substrate 14. The protective film 50 is made up of a silicon oxide film as a lower layer and a silicon nitride film as an upper layer in stacked relation. Openings are made at positions of the protective film 50 where the concave portions 42 are to be formed in the diode region 40 (FIG. 2A).

Figure 2B:
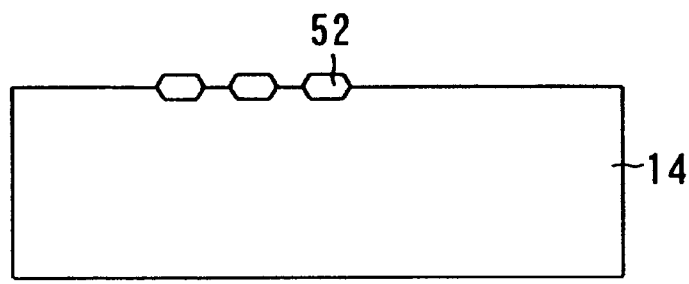

Performing field oxidation all over the P-type substrate 14 forms an oxide layer 52 where the concave portions 42 are to be formed. With the oxide layer 52 thus formed, the protective film 50 is removed from the surface of the P-type substrate 14 (FIG. 2B).

Figure 2C:
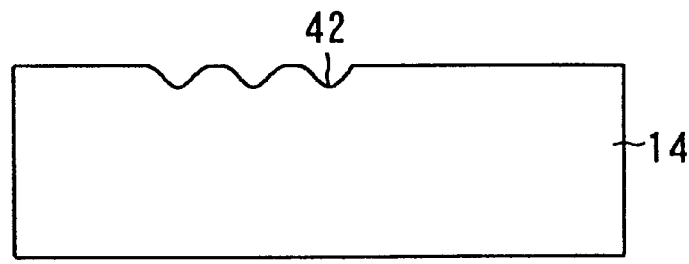

Wet etching is carried out to remove the oxide layer 52. This leaves a plurality of groove-like concave portions 42 formed on the surface of the P-type substrate 14 (FIG. 2C). The concave portions 42 may be produced alternatively by directly etching the P-type substrate 14 without forming the oxide layer 52. However, removing the oxide layer 52 to form the concave portion 60 causes significantly less stress to the P-type substrate 14 than if the latter were directly etched for concave formation. The inventive manufacturing method thus allows the concave portions 42 to be formed while minimizing any damage to the diode region 40.

Figure 2D:
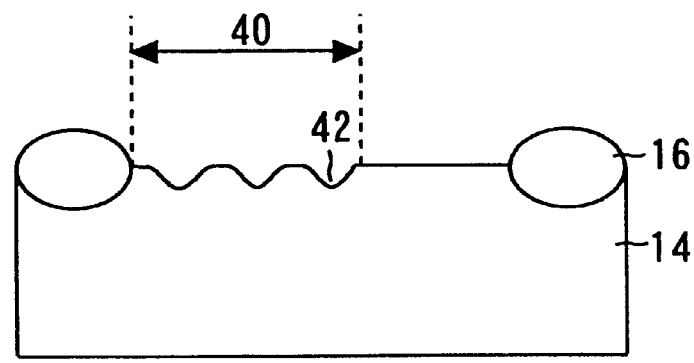

An isolation oxide film 16 is formed over the P-type substrate 14 in the same way that the oxide layer 52 was formed. The surface area of the P-type substrate 14 is divided into single-pixel regions by the isolation oxide film 16. Of the regions divided by the isolation oxide film 16, those where the concave portions 42 are formed are used as a diode region 40 each in the first embodiment (FIG. 2D).

Figure 2E:
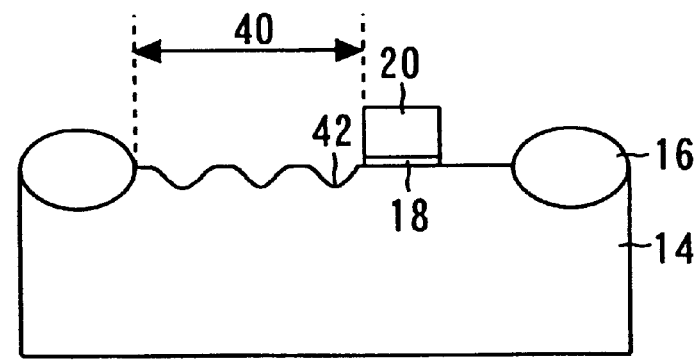

The gate oxide film 18 and the gate electrode 20 are formed in contiguous relation to the diode region 40, i.e., in such a manner that the film 18 and electrode 20 are contiguous to the concave portion 42 which is placed at the edge of the diode region 40 (FIG. 2E).

Figure 3A:
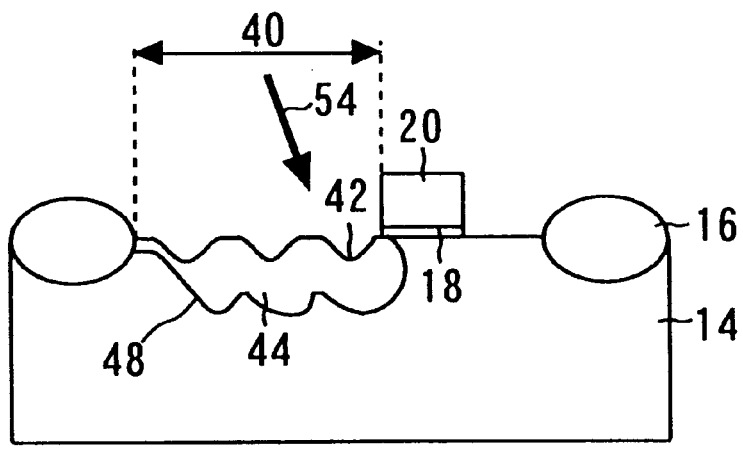

N-type impurities 54 are implanted into the diode region 40 of the P-type substrate 14 at a density of $10^{13}$ to $10^{14}$ atm/cm$^2$. The implantation is carried out at a predetermined angle relative to the P-type substrate 14 so that the N-type impurities 54 will reach a region immediately under the gate oxide film 18. As a result, the N-type region 44 extending from the diode region 40 to a portion submerged right beneath the gate oxide film 18 is formed in the P-type substrate 14 (FIG. 3A). That part of the N-type region 44 which is submerged beneath the gate oxide film 18 will be called the submerged portion hereunder.

On the P-type substrate 14, the concave portions 42 are formed at positions contiguous to the gate oxide film 18. The concave portions 42 formed on the surface of the P type substrate 14 make it easier for the N-type impurities 54 to reach a portion underneath the gate oxide film 18 than if the substrate surface were flat. The manufacturing method of the invention thus gives a significantly higher impurity concentration to the submerged portion of the N-type region 44 with the submerged portion occupying a greater volume beneath the film 18 than if the surface of the P-type substrate 14 were flat.

Figure 3B:
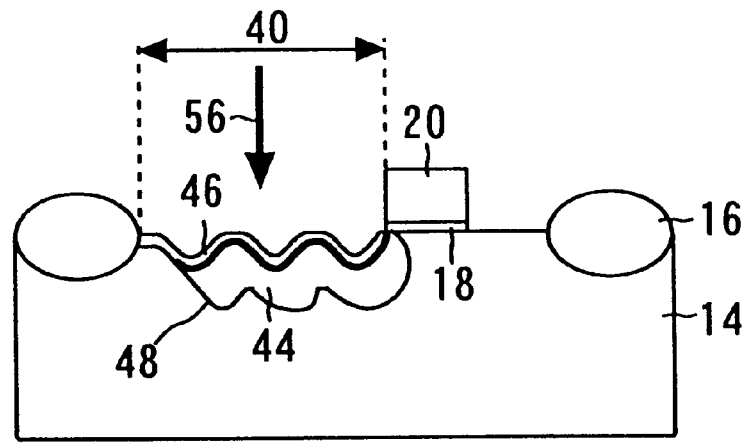

After the N-type region 44 is formed, P-type impurities 56 are implanted into the diode region 40 of the P-type substrate 14 at a density of $10^{13}$ to $10^{14}$ atm/cm$^2$. The implantation of the impurities 56 is carried out at an angle different from that in effect when the N-type impurities 54 were implanted, i.e., in a manner perpendicular to the P-type substrate 14. This produces a P-type region 46 covering the entire surface of the diode region 40. There is also formed a PN junction plane 48 approximately to a depth of 1000 angstroms from the surface of the P-type substrate 14 (FIG. 3B).

Figure 3C:
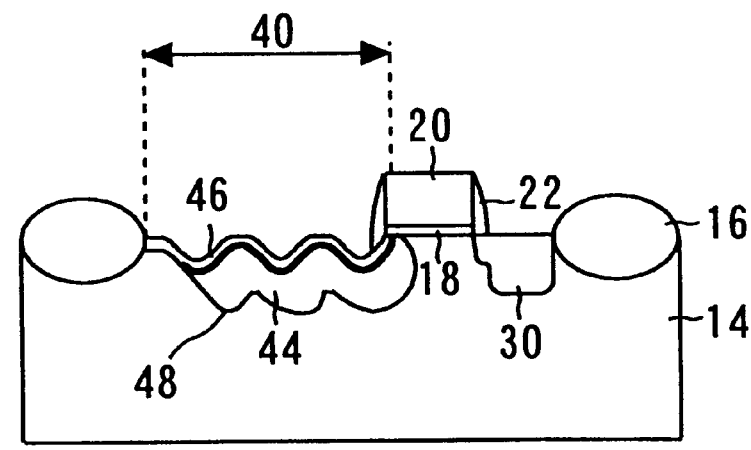

Disposed on the opposite side of the gate electrode 20 from the diode region 40 is an LDD structure N-type drain region 30. Side walls 22 are formed so as to laterally surround the gate electrode 20. The side walls 22 and the N-type drain region 30 are formed in a well-known manner (FIG. 3C). The steps above, when carried out as outlined, manufacture the semiconductor device as the first embodiment of the present invention.

As described, the inventive method of manufacturing the semiconductor device applies highly concentrated impurities to the submerged portion of the N-type region 44 and allows the submerged portion to take up a large volume under the gate oxide film 18. In that case, it is possible to ensure a sufficient carrier transfer capability in the submerged portion of the N-type region by controlling the spread of depletion layers inhibited in the submerged portion. The semiconductor device as the first embodiment thus transfers the light signal carrier generated by the PN junction diode 10 from the N-type region 44 to the N-type drain region 30 unfailingly so that the incidence of afterimage is effectively prevented.

In the semiconductor device practiced as the first embodiment, each of a plurality of concave portions 42 established in the diode region 40 manifests an enhanced capability of condensing light on the same principle as that of a convex lens. With the first embodiment, the PN junction plane 48 is shaped in wavelike fashion following the contour of the concave portions 42. The wavy plane affords a wide effective area to the diode region 40. The PN junction diode 10 proves to be more sensitive the higher the light-gathering ability of the diode region 40 and the wider the effective area of the PN junction plane 48. Thus the semiconductor device as the first embodiment implements a solid state image sensor having a high degree of integration and enhanced resolution.

An improved light-gathering capability based on the concave lens effect is also made available by furnishing the diode region 40 with a single V-shaped concave portion spreading all over the region 40. Such an alternative structure, if realized, will provide a PN junction plane having substantially the same effective area as that of the PN junction plane 48 of the first embodiment. The alternative structure, as with the structure of the first embodiment, makes it possible to let the N-type region submerge extensively underneath the gate electrode 20 in a manner ensuring a sufficient carrier transfer capability.

However, a single V-shaped concave portion spreading all over the diode region 40 entails a large difference in elevation between the edge and the center of the region 40. To stabilize the diode region 40 in electrical characteristics, it is required to implant N- and P-type impurities with a uniform distribution into the entire region 40. The density of the impurities and their depth of implantation are controlled easily and more precisely than if there did not exist a large difference in elevation in the diode region 40. In that sense, the presence of the single V-shaped concave portion in the diode region 40 does not necessarily promote accurate control of the impurities in the entire region 40.

The first embodiment of the invention involves establishing a plurality of concave portions 42 each having a small difference in elevation between the edge and the center. This structure makes it possible to manage easily and accurately the state of impurities to be implanted into the diode region 40 when the N-type region 44 and P-type region 46 are to be formed therein. That is, the structure of the first embodiment keeps the semiconductor device more stable in electrical characteristics than the single V-shaped concave structure does.

Second Embodiment

Figure 4:
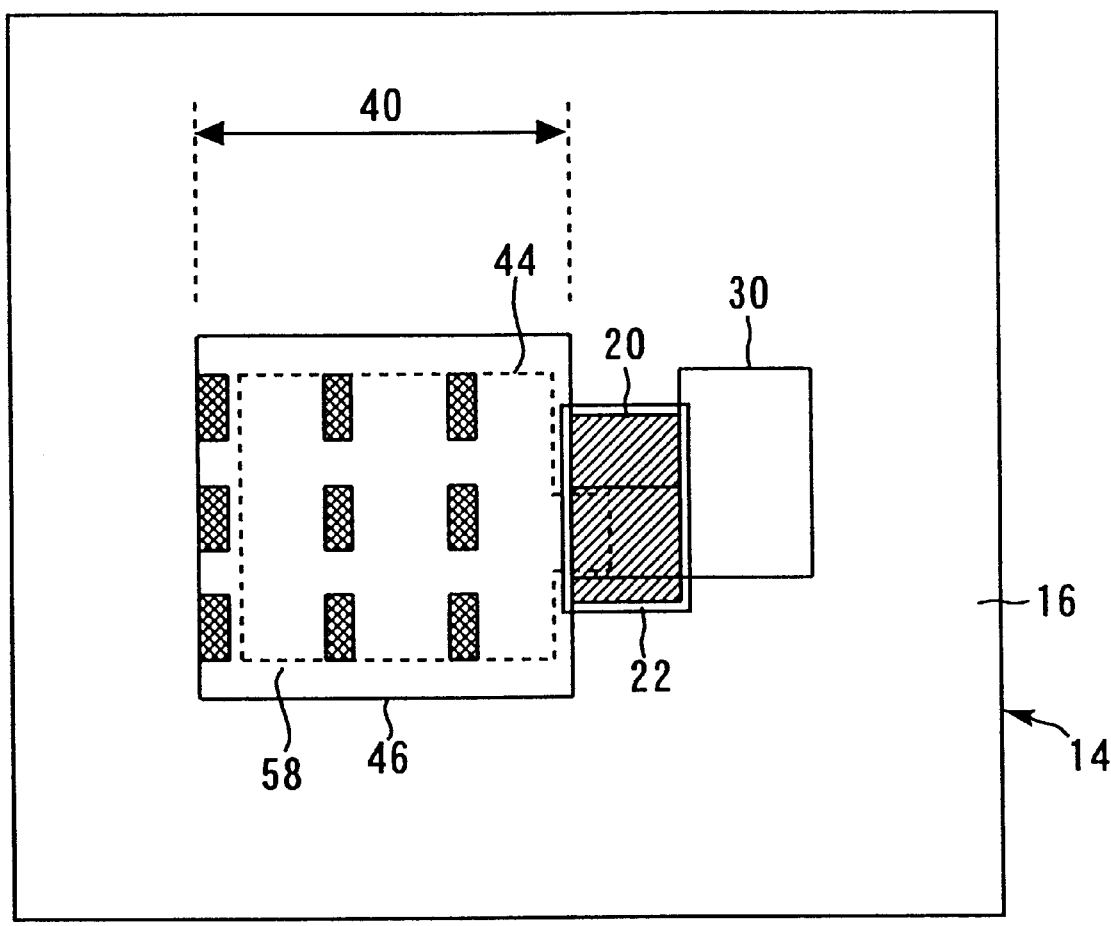
FIG. 4 is a plan view of a semiconductor device practiced as a second embodiment of the present invention.

A second embodiment of the present invention will now be described with reference to FIG. 4. FIG. 4 is a plan view of a semiconductor practiced as the second embodiment. As in the case of FIG. 1B, FIG. 4 shows a typical structure corresponding to a single pixel. The semiconductor device as the second embodiment is similar in structure to the first embodiment except that the second embodiment has a grid-like concave portion 58 in the diode region 40.

The second embodiment provides finer convex and concave portions in the diode region 40 than the first embodiment. Accordingly, the second embodiment makes it possible to further improve the light-gathering ability of the diode region 40 as well as further enlarge the effective area of the PN junction plane 48 compared with those in the first embodiment. Thus the semiconductor device as the second embodiment affords a degree of integration and a level of resolution equivalent to or higher than those of the first embodiment.

Third Embodiment

Figure 5A:
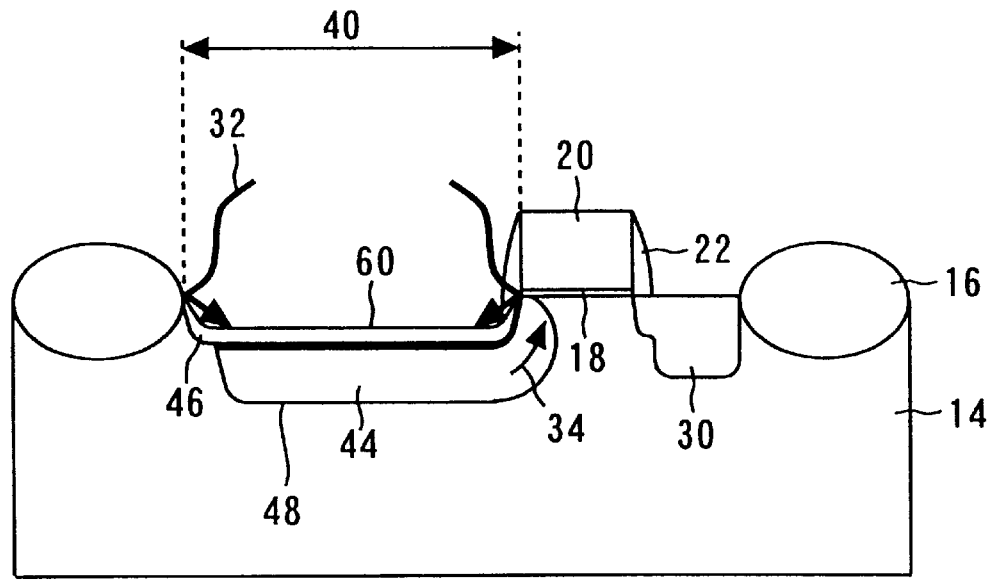
FIG. 5A is a cross-sectional view of a semiconductor device practiced as a third embodiment of the present invention.
Figure 5B:
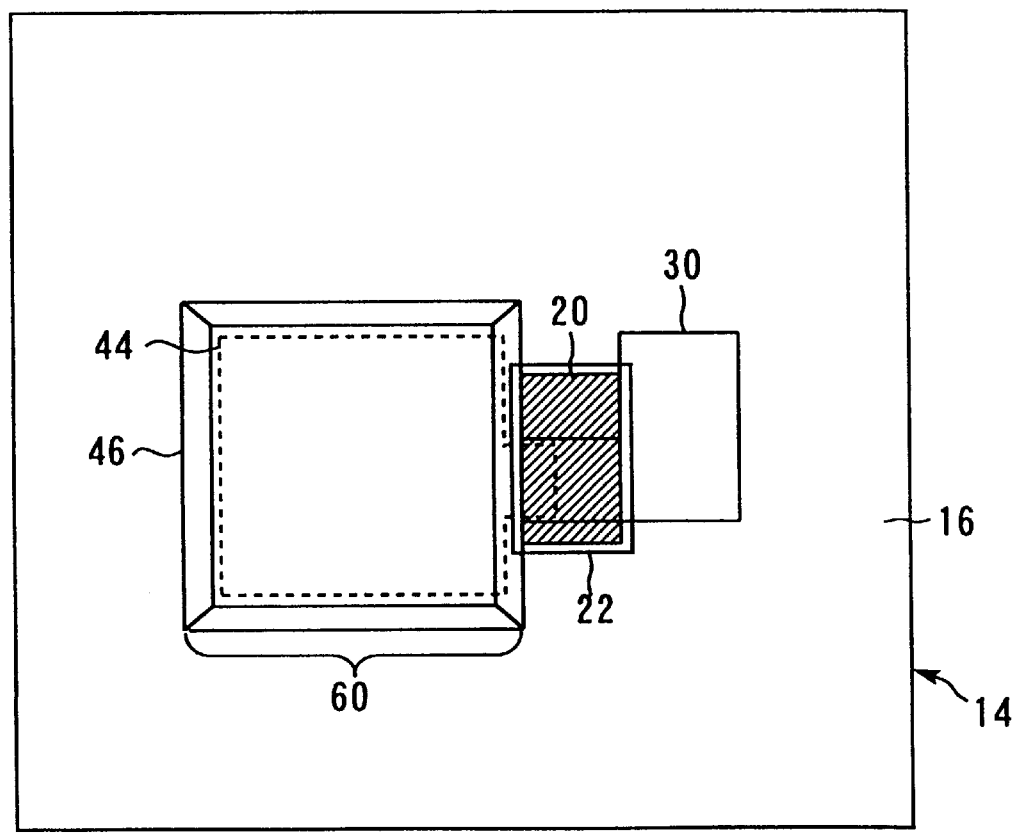
FIG. 5B is a plan view of the semiconductor device as the third embodiment.

A third embodiment of the present invention will now be described with reference to FIGS. 5A through 7C. FIG. 5A is a cross-sectional view of a semiconductor device practiced as the third embodiment. FIG. 5B is a plan view of the semiconductor device as the third embodiment. This semiconductor device comprises a single concave portion 60 spreading all over the diode region 40. The concave portion 60 has the same depth as the concave portions 42 of the first embodiment. The third embodiment is similar in structure to the first embodiment except that the third embodiment has a single concave portion 60 replacing the multiple concave portions 42.

The structure of the third embodiment has the concave portion 60 formed adjacent to the gate electrode 20. This makes it possible, as with the first embodiment, to give highly concentrated impurities to a submerged portion of the N-type region 44 and to let the submerged portion take up a large volume under the gate oxide film 18. With such a structure, the third embodiment effectively prevents the incidence of afterimage.

In the third embodiment, the diode region 40 provides an excellent light-gathering ability based on the concave lens effect derived from the concave portion 60. Its structure allows the third embodiment to ensure a wider effective area for the PN junction plane 48 than if the surface of the P-type substrate 14 were flat. Thus the semiconductor device of the third embodiment offers a high degree of integration and enhanced resolution.

The concave portion 60 of the third embodiment has substantially the same depth as the concave portions 42 of the first embodiment. For this reason, despite the presence of its single concave portion in the diode region 40, the third embodiment permits a desired distribution of impurities to the N- and P-type regions 44 and 46 as precisely as the first embodiment. The structure of the third embodiment thus renders the semiconductor device as stable in electrical characteristics as the first embodiment.

Figure 6A:
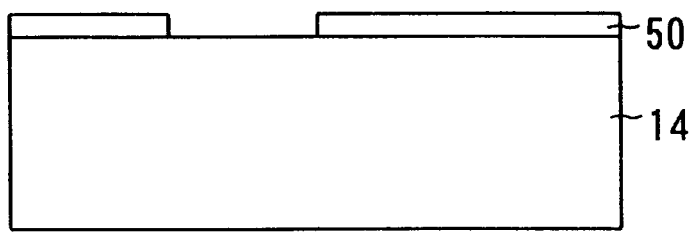
FIGS. 6A to 6E and FIGS. 7A to 7C are cross-sectional views for describing a manufacturing method of the semiconductor device as the third embodiment.

An inventive method of manufacturing the semiconductor device as the third embodiment will now be described with reference to FIGS. 6A through 7C. Initially, a protective film 50 is formed over the P-type substrate 14. An opening spreading approximately over the entire diode region 40 is patterned on the protective film 50 (FIG. 6A)

Figure 6B:
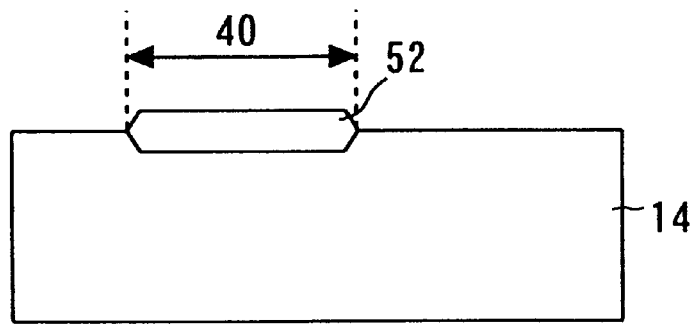

Performing field oxidation all over the P-type substrate 14 forms an oxide layer 52 over the entire diode region 40. With the oxide layer 52 thus formed, the protective film 50 is removed from the surface of the P-type substrate 14 (FIG. 6B).

Figure 6C:
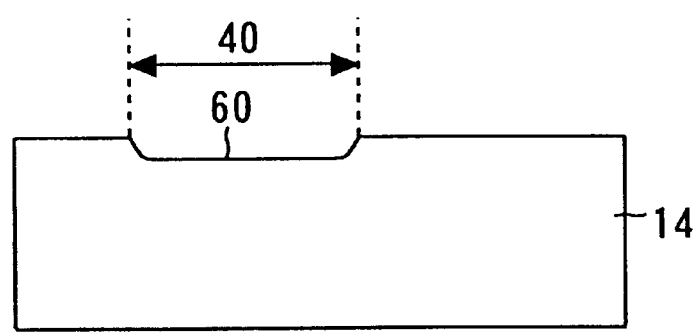
Figure 6D:
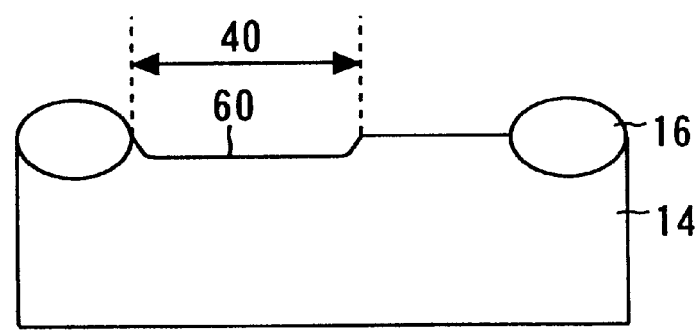
Figure 6E:
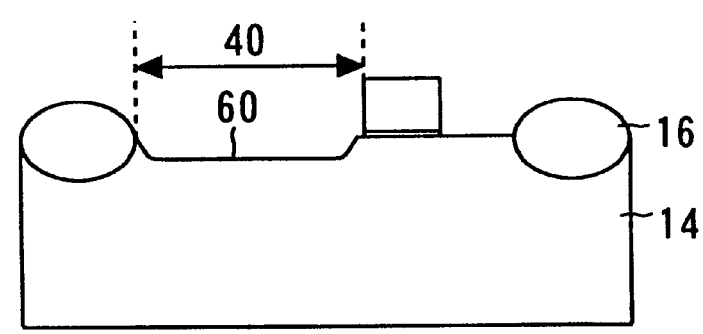
Figure 7A:
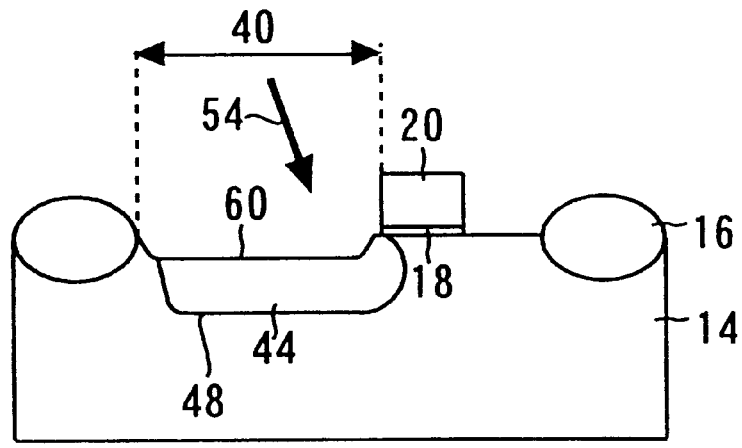
Figure 7B:
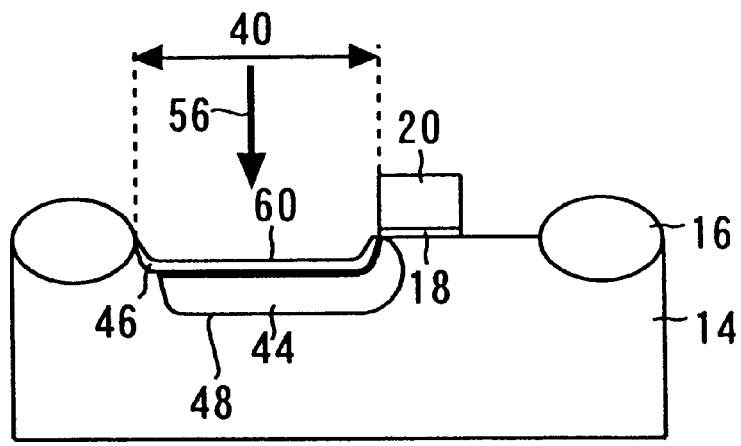
Figure 7C:
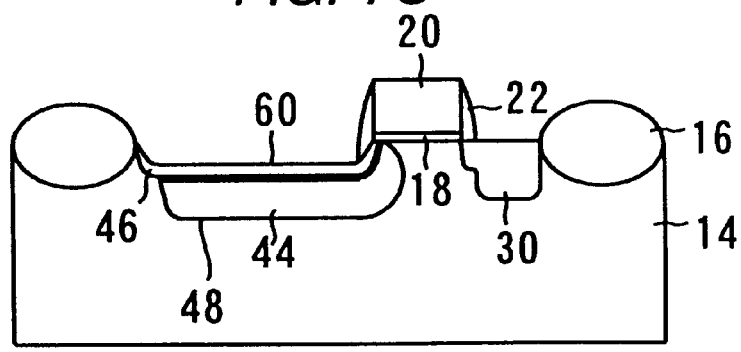

Wet etching is carried out to remove the oxide layer 52. This leaves a concave portion 60 formed over the entire diode region 40 on the surface of the P-type substrate 14 (FIG. 6C).

The concave portion 60 may be produced alternatively by directly etching the P-type substrate 14 without forming the oxide layer 52. However, removing the oxide layer 52 to form the concave portion 60 causes significantly less stress to the P-type substrate 14 than if the latter were directly etched for concave formation. The inventive manufacturing method thus allows the concave portion 60 to be formed while minimizing any damage to the diode region 40.

Thereafter, the same steps as those used for the first embodiment are carried out to manufacture the semiconductor device as the third embodiment (see FIGS. 2D through 3C and 6D through 7C).

Fourth Embodiment

Figure 8A:
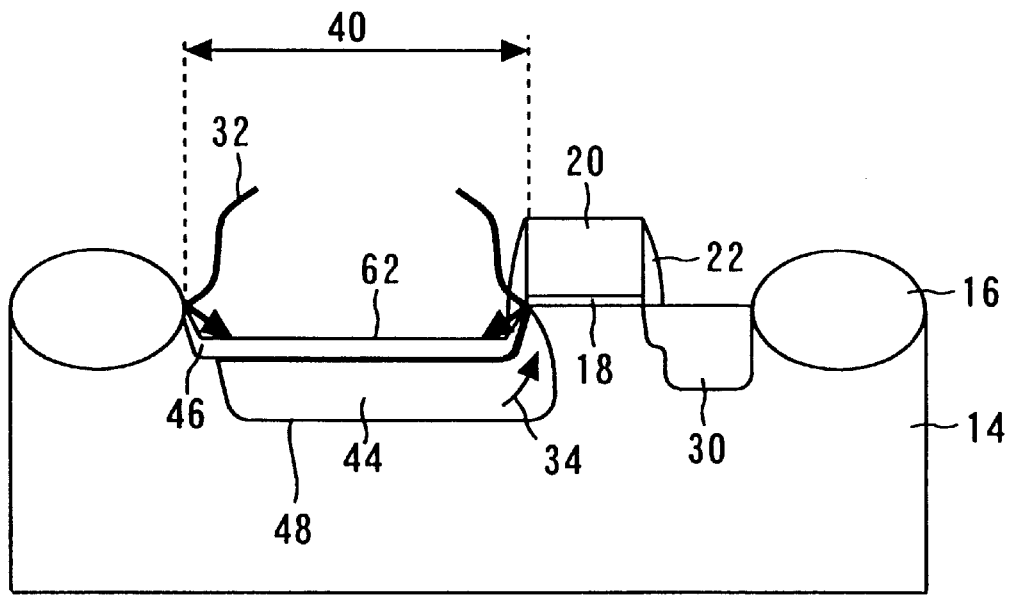
FIG. 8A is a cross-sectional view of a semiconductor device practiced as a fourth embodiment of the present invention.
Figure 8B:
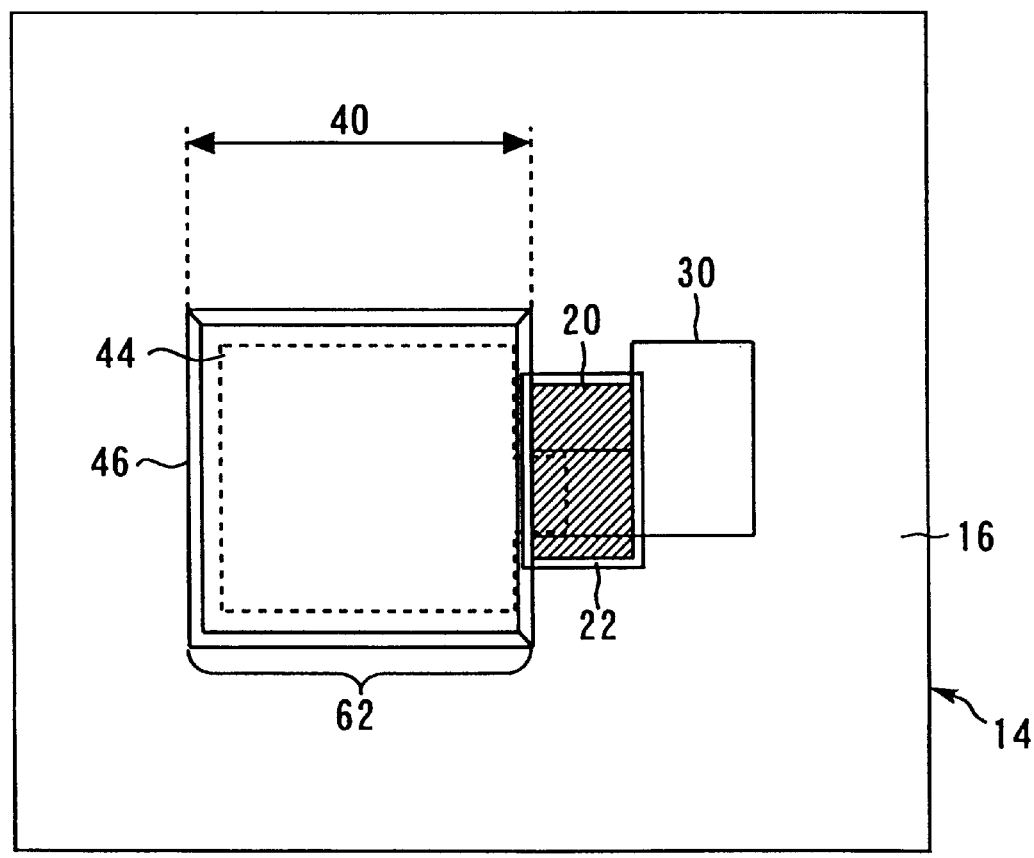
FIG. 8B is a plan view of the semiconductor device as the fourth embodiment.

A fourth embodiment of the present invention will now be described with reference to FIGS. 8A through 10C. FIG. 8A is a cross-sectional view of a semiconductor device practiced as the fourth embodiment. FIG. 8B is a plan view of the semiconductor device as the fourth embodiment. This semiconductor device comprises a single concave portion 62 spreading all over the diode region 40. The fourth embodiment is similar in structure to the third embodiment except that the fourth embodiment has the concave portion 62 formed in such a manner that its edges (i.e., borders between side and bottom) are more acute than those of the concave portion 60.

As with the third embodiment, the fourth embodiment in the structure outlined above effectively prevents the incidence of afterimage, ensures a sufficient light-gathering capability of the diode region 40, allocates a sufficiently wide effective area for the PN junction plane 48, and stabilizes the resulting semiconductor device in electrical characteristics.

An inventive method of manufacturing the semiconductor device as the fourth embodiment will now be described with reference to FIGS. 9A through 10C.

Figure 9A:
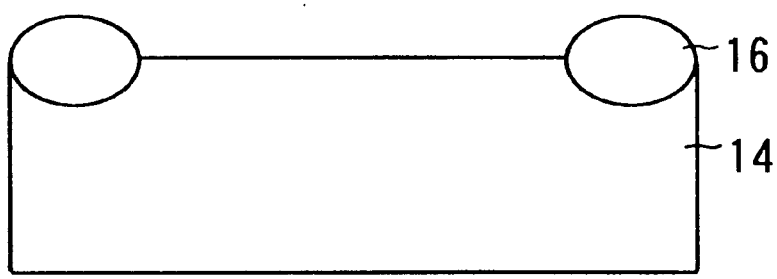
FIGS. 9A to 9D and FIGS. 10A to 10C are cross-sectional views for describing a manufacturing method of the semiconductor device as the fourth embodiment.

For the manufacture of the semiconductor device as the fourth embodiment, an isolation oxide film 16 is initially formed to divide the P-type substrate 14 into single-pixel regions (FIG. 9A). The isolation oxide film 16 is produced in the same steps as those used for the first through the third embodiment above.

Figure 9B:
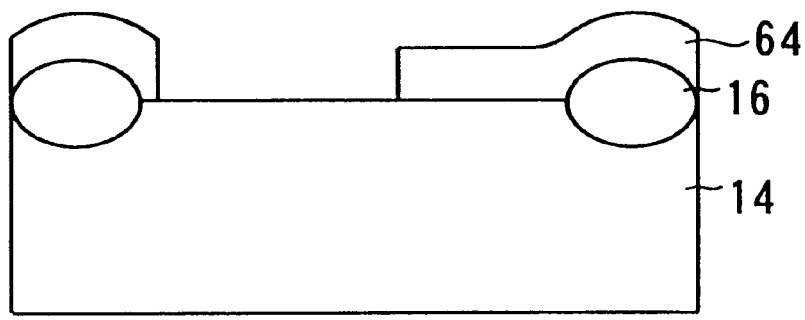

A photo resist film 64 is formed over the surface of the P-type substrate 14. An opening spreading approximately over the entire diode region 40 is patterned on the photo resist film 64 (FIG. 9B).

Figure 9C:
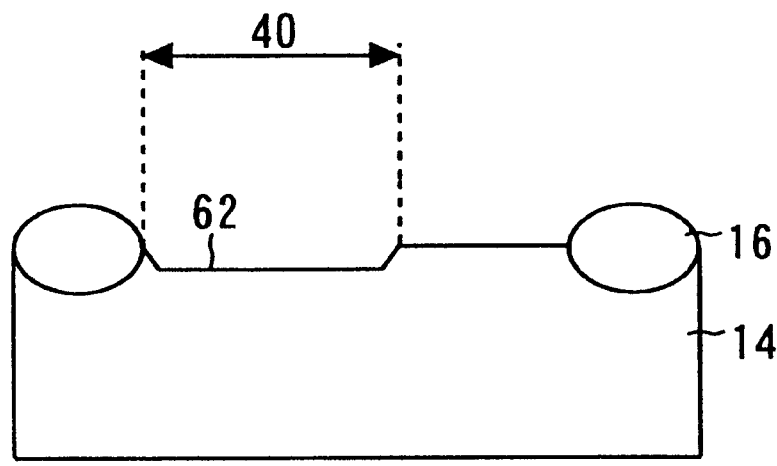
Figure 9D:
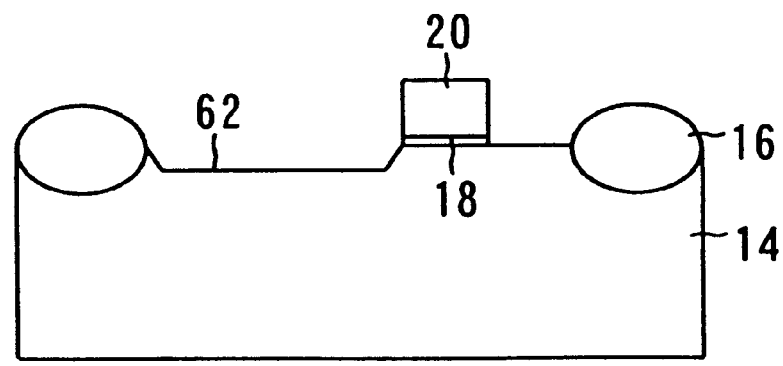
Figure 10A:
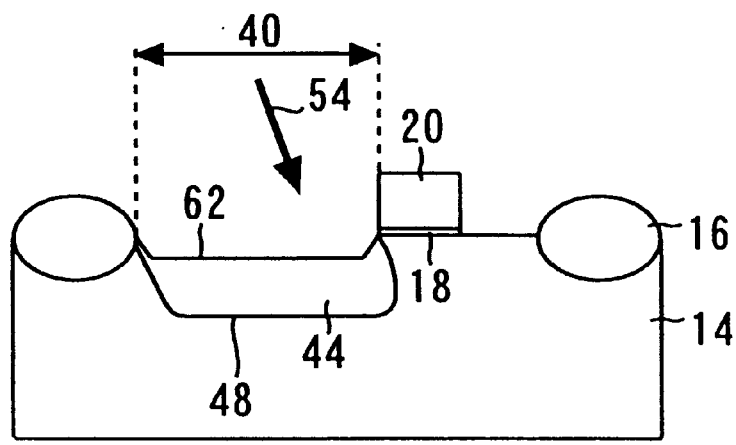
Figure 10B:
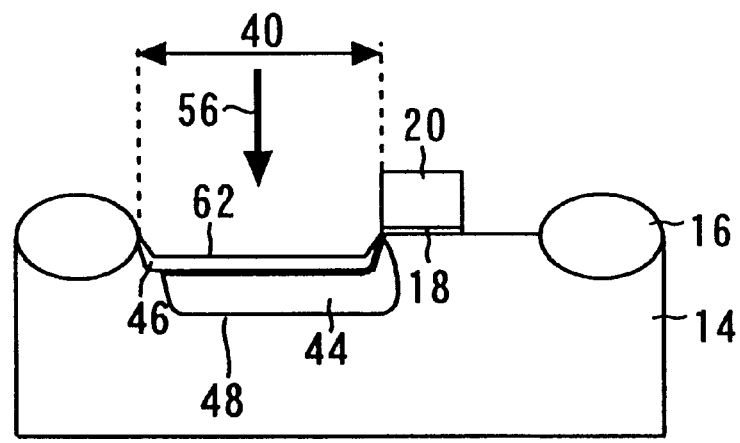
Figure 10C:
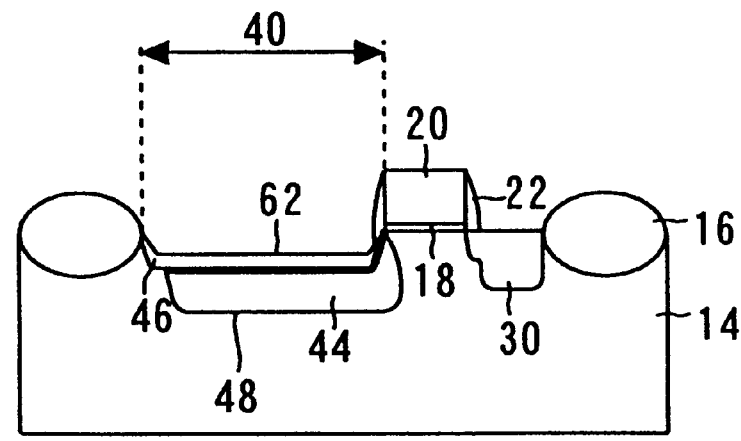

With the photo resist film 64 used as a mask, dry etching is carried out to form the concave portion 62. The dry etching process is performed under conditions where the side walls of the concave portion 62 are tilted at a predetermined angle and where the bottom of the portion 62 is flat (FIG. 9C).

Thereafter, the same steps as those used for the first embodiment are carried out to manufacture the semiconductor device as the fourth embodiment (see FIGS. 2E through 3C and 9D through 10C).

As described, the inventive manufacturing method above causes the concave portion 62 of the fourth embodiment to be formed without producing an oxide layer over the P-type substrate 14. Although this method leaves the diode region 40 somewhat damaged during etching, the manufacturing steps are appreciably simplified. Because the method causes the P-type substrate 14 to be directly etched so as to form the concave portion 62, the dimensional accuracy of the concave portion 62 is enhanced. The method of manufacturing the fourth embodiment thus makes it easy to produce a semiconductor device with a higher degree of integration than the method of manufacturing the third embodiment.

Fifth Embodiment

Figure 11A:
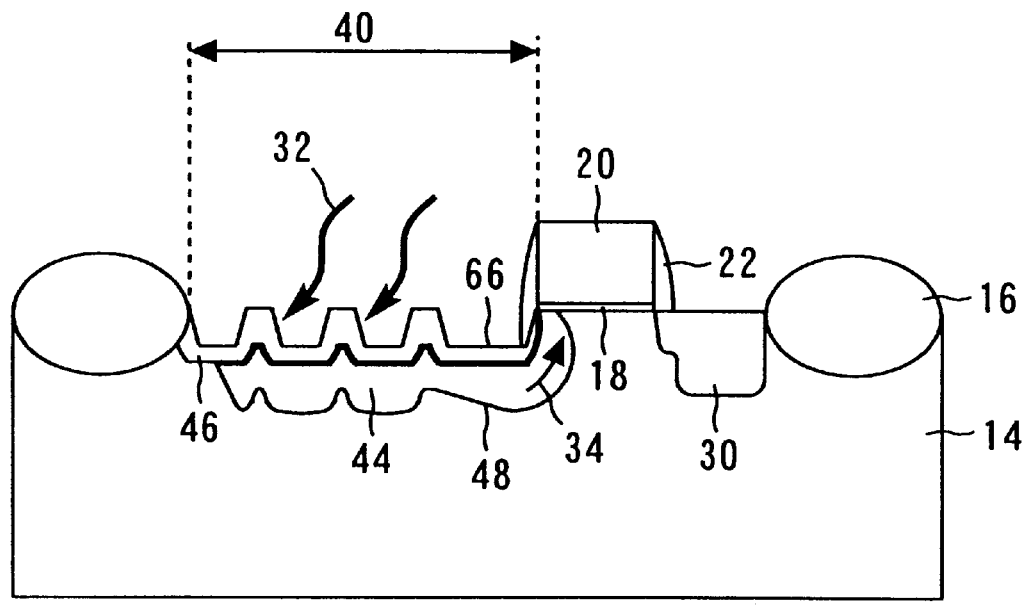
FIG. 11A is a cross-sectional view of a semiconductor device practiced as a fifth embodiment of the present invention.
Figure 11B:
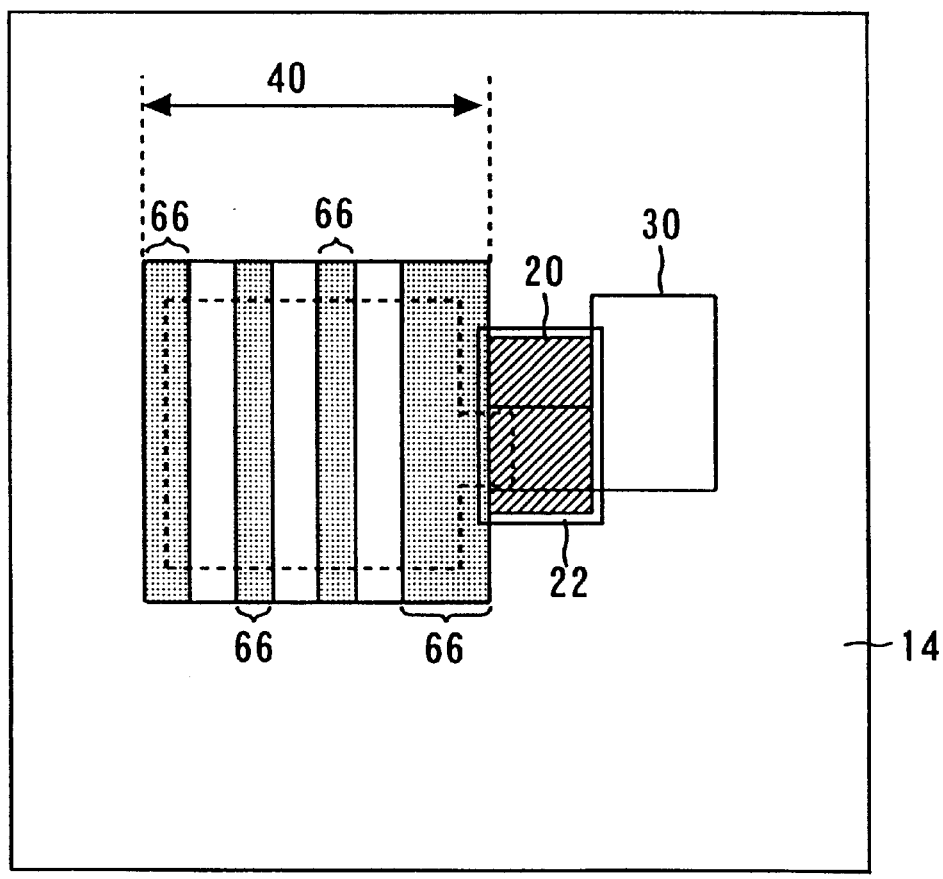
FIG. 11B is a plan view of the semiconductor device as the fifth embodiment.

A fifth embodiment of the present invention will now be described with reference to FIGS. 11A through 13C. FIG. 11A is a cross-sectional view of a semiconductor device practiced as the fifth embodiment. FIG. 11B is a plan view of the semiconductor device as the fifth embodiment. This semiconductor device comprises a plurality of concave portions 66 inside the diode region 40. The fifth embodiment is similar in structure to the first embodiment except that the fifth embodiment has the concave portions 66 formed in such a manner that their edges (i.e., borders between side and bottom) are more acute than those of the concave portions 42 of the first embodiment (see FIG. 1A).

As with the first embodiment, the fifth embodiment in the structure outlined above effectively prevents the incidence of afterimage, ensures a sufficient light-gathering capability of the diode region 40, allocates a sufficiently wide effective area for the PN junction plane 48, and stabilizes the resulting semiconductor device in electrical characteristics.

An inventive method of manufacturing the semiconductor device as the fifth embodiment will now be described with reference to FIGS. 12A through 13C.

Figure 12A:
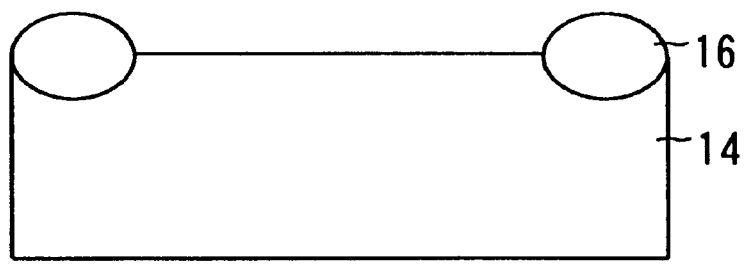
FIGS. 12A to 12D and FIGS. 13A to 13C are cross-sectional views for describing a manufacturing method of the semiconductor device as the fifth embodiment.

For the manufacture of the semiconductor device as the fifth embodiment, an isolation oxide film 16 is initially formed to divide the P-type substrate 14 into single-pixel regions (FIG. 12A). The isolation oxide film 16 is produced in the same steps as those used for the first through the third embodiment above.

Figure 12B:
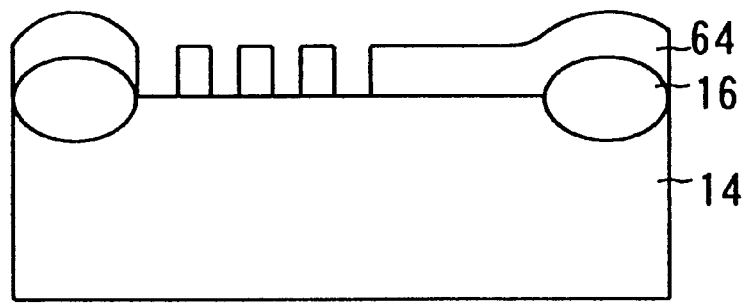

A photo resist film 64 is formed over the surface of the P-type substrate 14. Openings are patterned on the photo resist film 64 at positions where the concave portions 66 are to be formed (FIG. 12B).

Figure 12C:
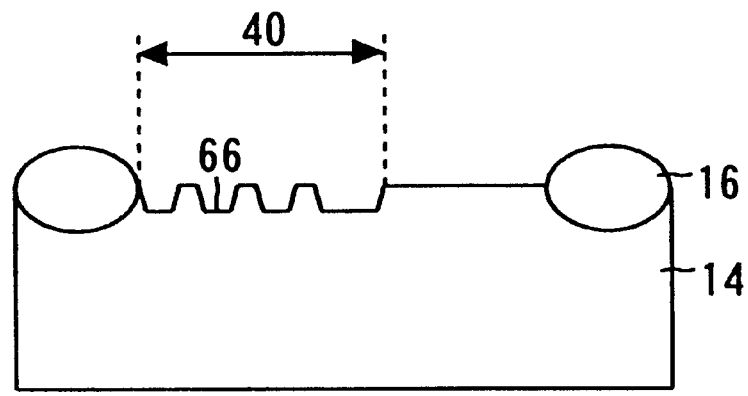
Figure 12D:
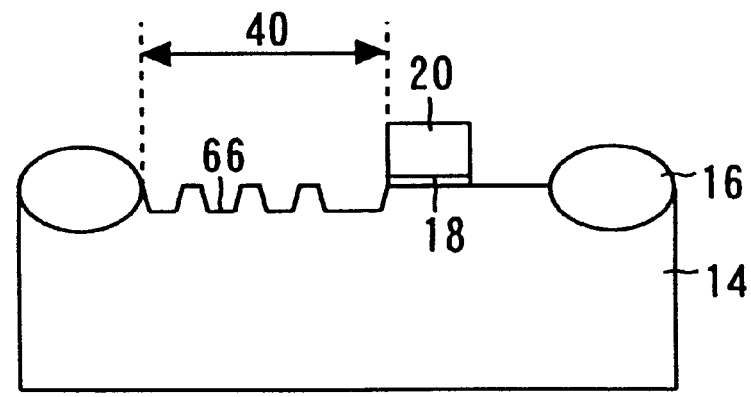
Figure 13A:
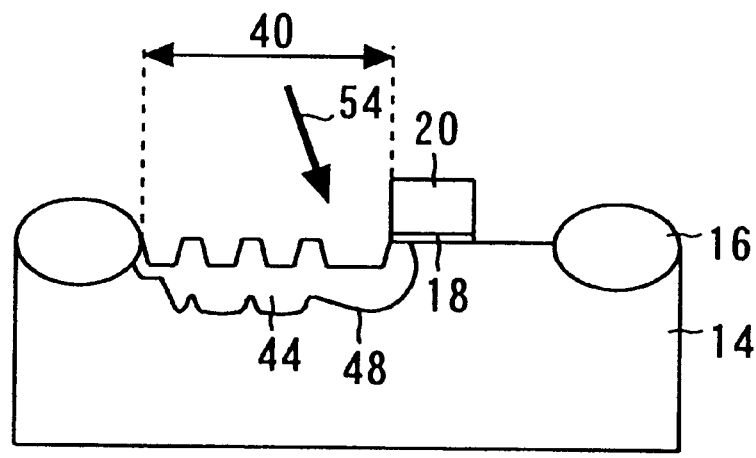
Figure 13B:
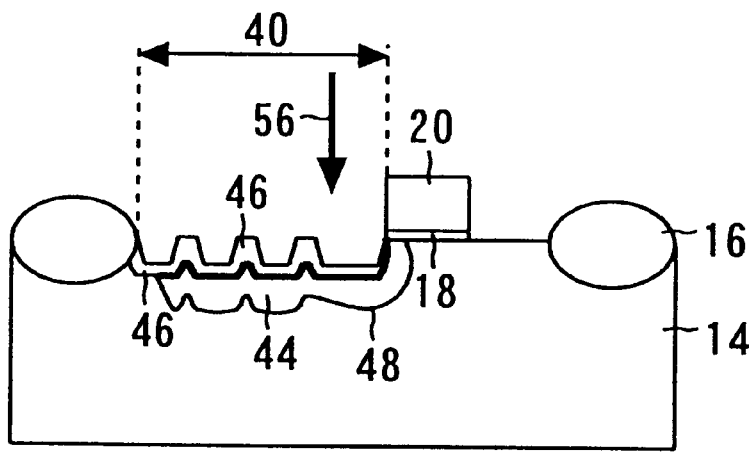
Figure 13C:
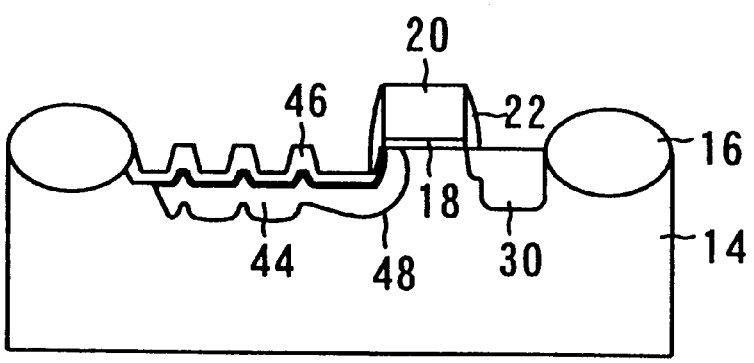

With the photo resist film 64 used as a mask, dry etching is carried out to form the concave portions 66. The dry etching process is performed under conditions where the side walls of the individual concave portions 66 are tilted at a predetermined angle and where the bottoms of the portions 66 are flat (FIG. 12C).

Thereafter, the same steps as those used for the first embodiment are carried out to manufacture the semiconductor device as the fifth embodiment (see FIGS. 2E through 3C and 12D through 13C).

As described, the inventive manufacturing method above causes the concave portions 66 of the fifth embodiment to be formed without producing an oxide layer over the P-type substrate 14. Although this method leaves the diode region 40 somewhat damaged during etching, the manufacturing steps are appreciably simplified. Because the method causes the P-type substrate 14 to be directly etched so as to form the concave portions 66, the dimensional accuracy of the portions 66 is enhanced. The method of manufacturing the fifth embodiment thus makes it easy to produce a semiconductor device with a higher degree of integration than the method of manufacturing the first embodiment.

Sixth Embodiment

Figure 14:
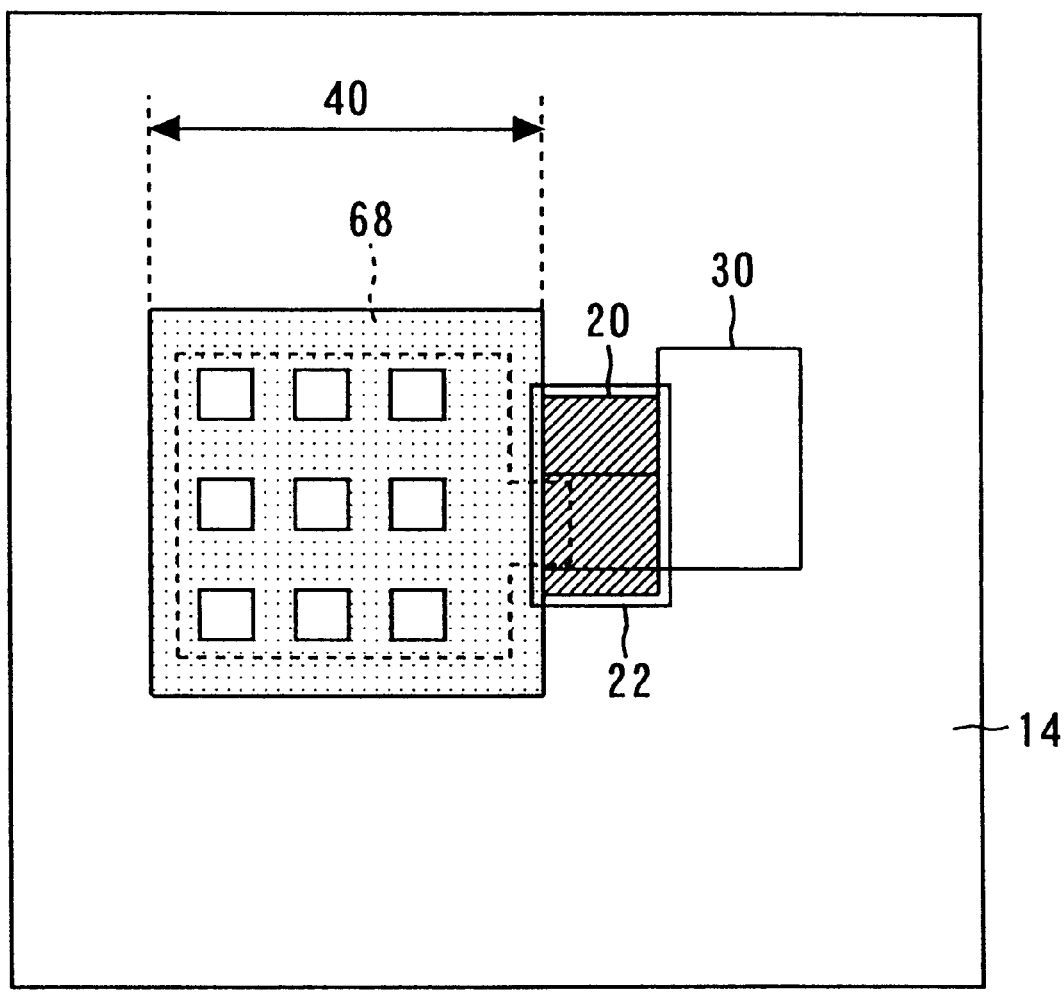
FIG. 14 is a plan view of a semiconductor device practiced as a sixth embodiment of the present invention.

A sixth embodiment of the present invention will now be described with reference to FIG. 14. FIG. 14 is a plan view of a semiconductor device practiced as the sixth embodiment. As in the case of FIG. 11B for the fifth embodiment, FIG. 14 shows a typical structure corresponding to a single pixel. The semiconductor device as the sixth embodiment is similar in structure to the fifth embodiment except that the sixth embodiment has a grid-like concave portion 68 in the diode region 40.

The sixth embodiment provides finer convex and concave portions in the diode region 40 than the first embodiment. Accordingly, the sixth embodiment makes it possible to further improve the light-gathering ability of the diode region 40 as well as further enlarge the effective area of the PN junction plane 48 compared with those in the fifth embodiment. Thus the semiconductor device as the sixth embodiment affords a degree of integration and a level of resolution equivalent to or higher than those of the fifth embodiment.

Seventh Embodiment

Figure 15A:
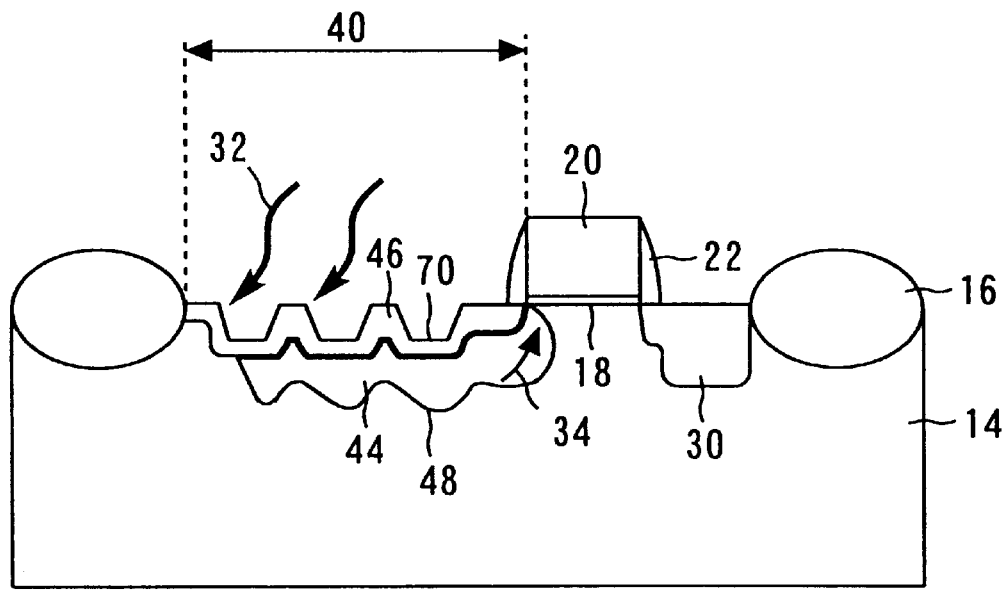
FIG. 15A is a cross-sectional view of a semiconductor device practiced as a seventh embodiment of the present invention.
Figure 15B:
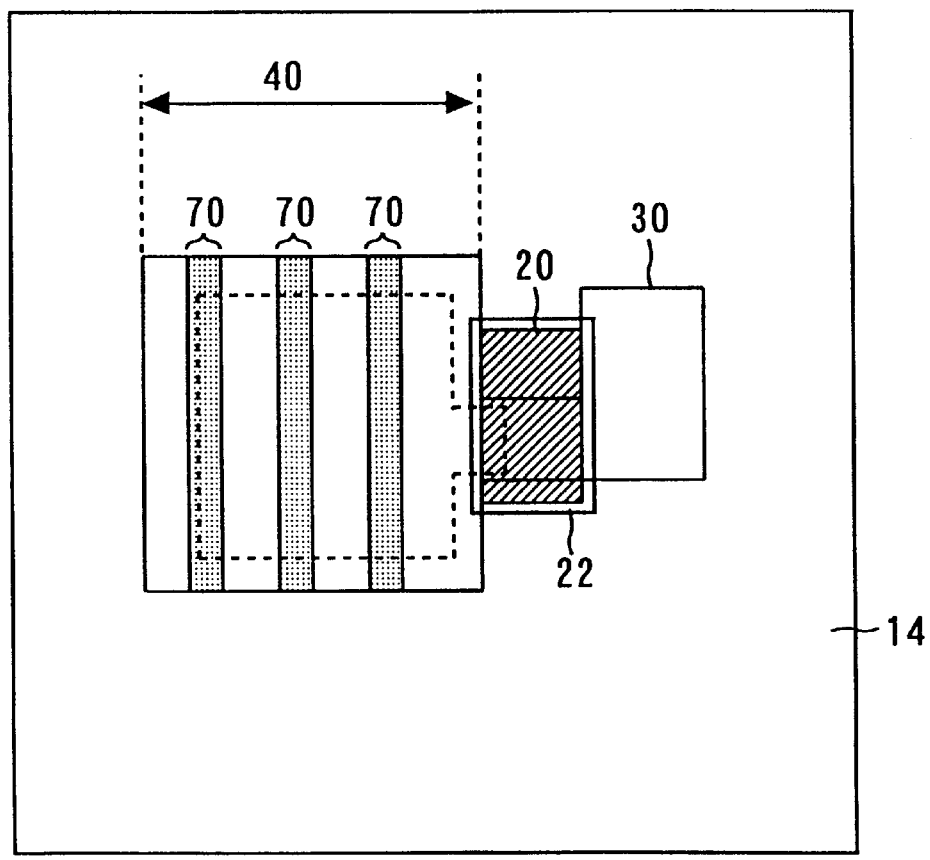
FIG. 15B is a plan view of the semiconductor device as the seventh embodiment.

A seventh embodiment of the present invention will now be described with reference to FIGS. 15A through 17C. FIG. 15A is a cross-sectional view of a semiconductor device practiced as the seventh embodiment. FIG. 15B is a plan view of the semiconductor device as the seventh embodiment. This semiconductor device comprises a plurality of concave portions 70 in the diode region 40. The seventh embodiment is similar in structure to the fifth embodiment except that the concave portions 70 are spaced a predetermined distance away from the gate electrode 20.

As with the fifth embodiment, the seventh embodiment in the structure outlined above ensures a sufficient light gathering capability of the diode region 40, allocates a sufficiently wide effective area for the PN junction plane 48, and stabilizes the resulting semiconductor device in electrical characteristics.

An inventive method of manufacturing the semiconductor device as the seventh embodiment will now be described with reference to FIGS. 16A through 17C.

Figure 16A:
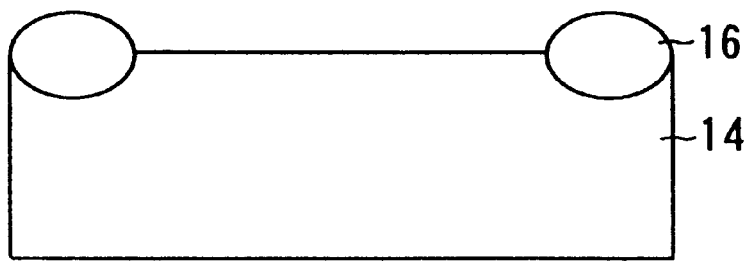
FIGS. 16A to 16D and FIGS. 17A to 17C are cross-sectional views for describing a manufacturing method of the semiconductor device as the seventh embodiment.
Figure 16B:
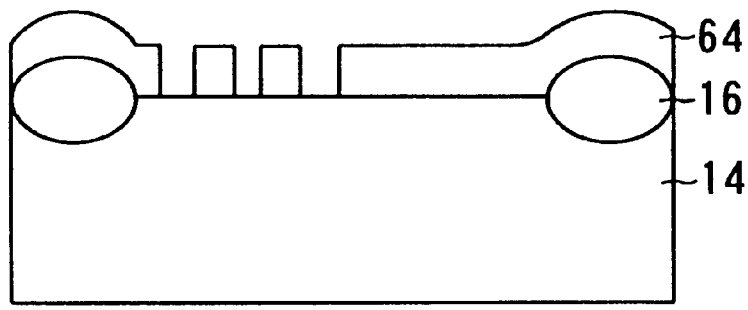

For the manufacture of the semiconductor device as the seventh embodiment, an isolation oxide film 16 is initially formed over the P-type substrate 14 (FIG. 16A). A photo resist film 64 is then formed on the P-type substrate 14. Openings are patterned on the photo resist film 64 at positions where the concave portions 70 are to be formed (FIG. 16B).

Figure 16C:
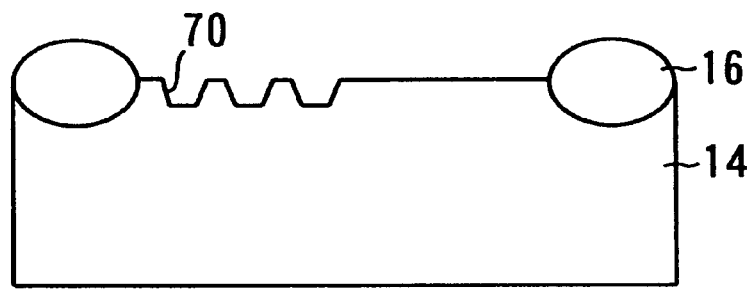

With the photo resist film 64 used as a mask, dry etching is carried out to form a plurality of concave portions 70. The dry etching process is performed under conditions where the side walls of the individual concave portions 70 are tilted at a predetermined angle and where the bottoms of the portions 70 are flat (FIG. 16C).

Figure 16D:
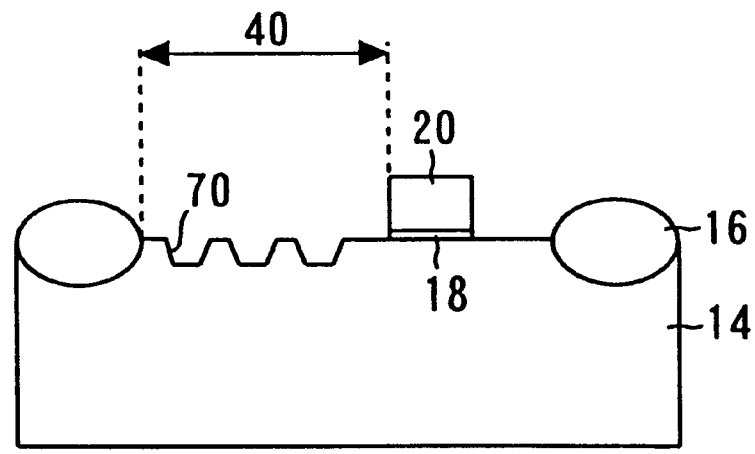
Figure 17A:
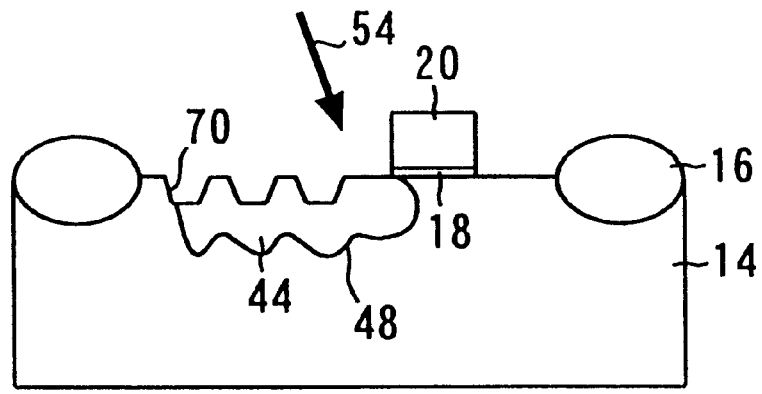
Figure 17B:
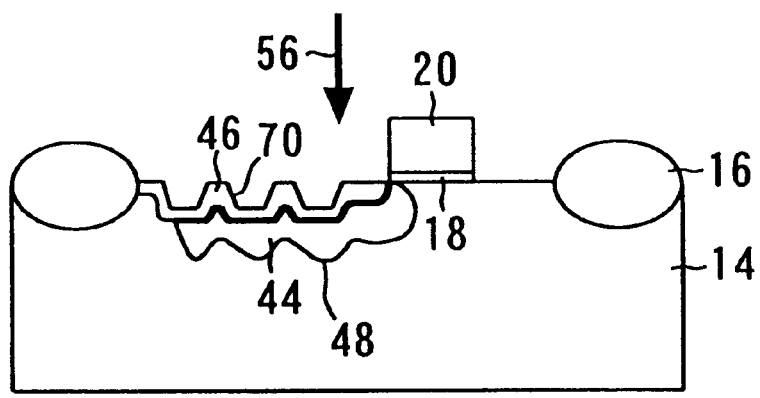
Figure 17C:
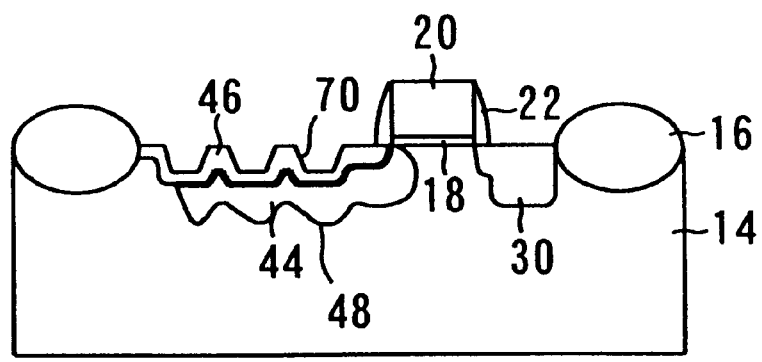

The gate oxide film 18 and gate electrode film 20 are formed at a predetermined distance away from the closest of concave portions 70 in the diode region 40 (FIG. 16D).

Thereafter, the same steps as those used for the first embodiment are carried out to fabricate the semiconductor device as the seventh embodiment (see FIGS. 3A through 3C and 17A through 17C).

Eighth Embodiment

Figure 18:
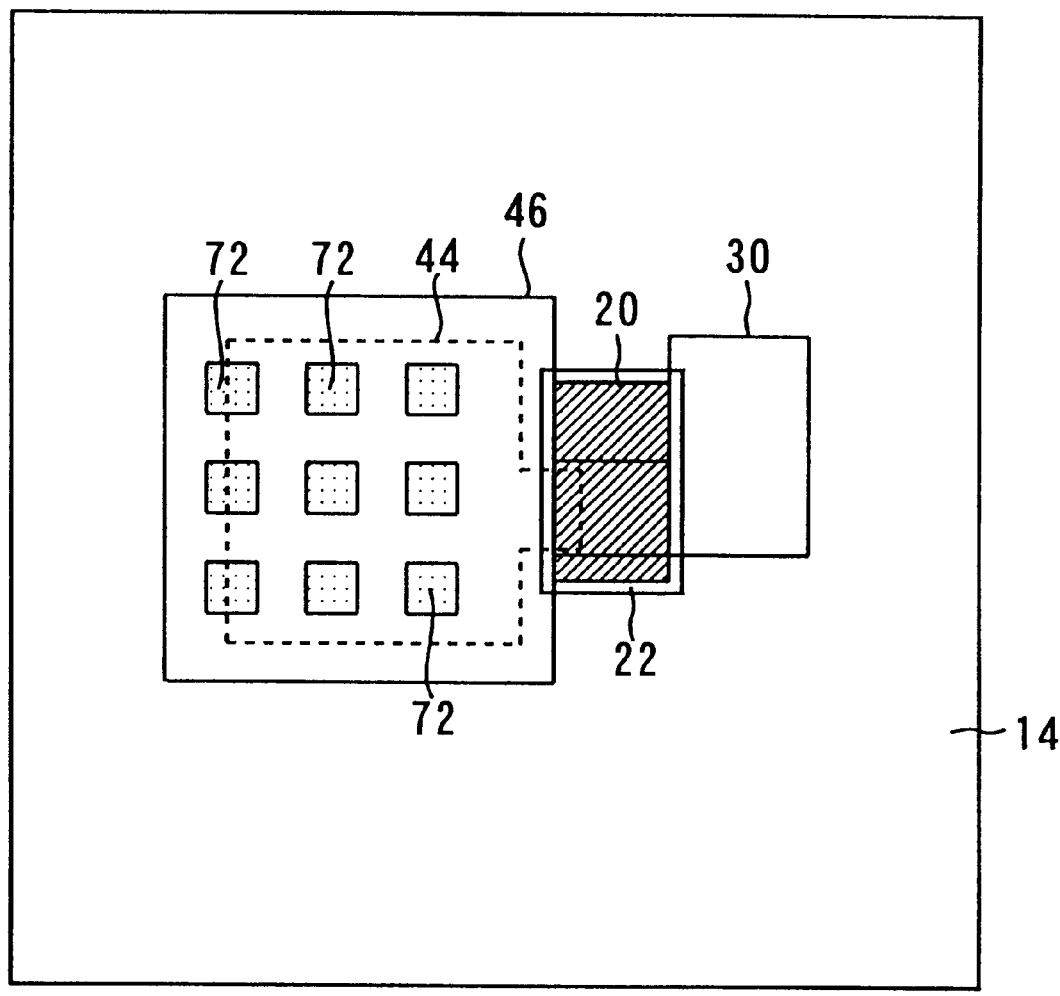
FIG. 18 is a plan view of a semiconductor device practiced as a eighth embodiment of the present invention.

An eighth embodiment of the present invention will now be described with reference to FIG. 18. FIG. 18 is a plan view of a semiconductor device practiced as the eighth embodiment. As in the case of FIG. 15B for the seventh embodiment, FIG. 18 shows a typical structure corresponding to a single pixel. The semiconductor device as the eighth embodiment is similar in structure to the seventh embodiment except that the eighth embodiment has a grid-like concave portion 72 in the diode region 40.

The eighth embodiment provides finer convex and concave portions in the diode region 40 than the seventh embodiment. Accordingly, the eighth embodiment makes it possible to further improve the light-gathering ability of the diode region 40 as well as further enlarge the effective area of the PN junction plane 48 compared with those in the seventh embodiment. Thus the semiconductor device as the eighth embodiment affords a degree of integration and a level of resolution equivalent to or higher than those of the seventh embodiment.

Ninth Embodiment

Figure 19A:
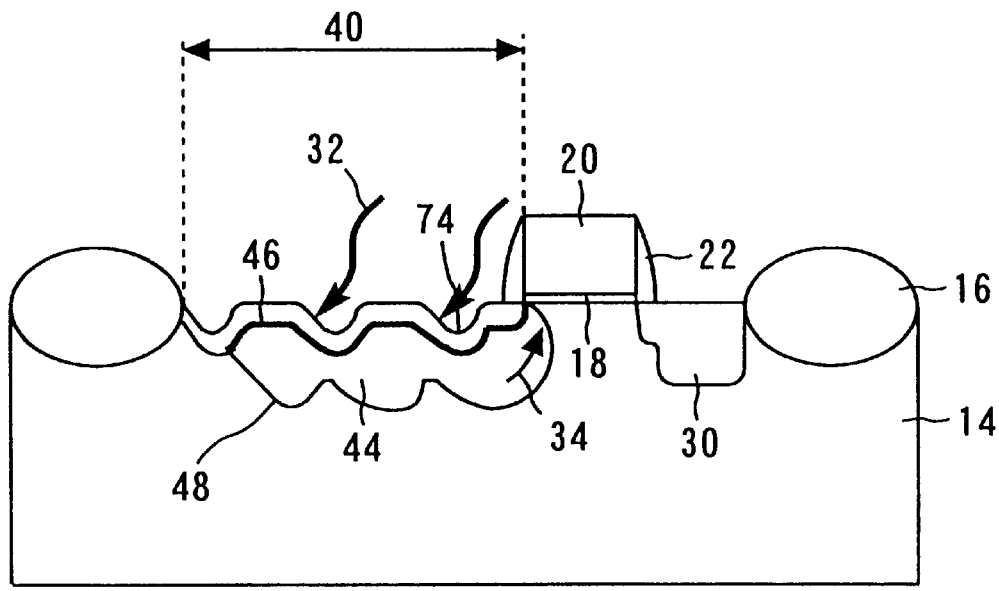
FIG. 19A is a cross-sectional view of a semiconductor device practiced as a ninth embodiment of the present invention.
Figure 19B:
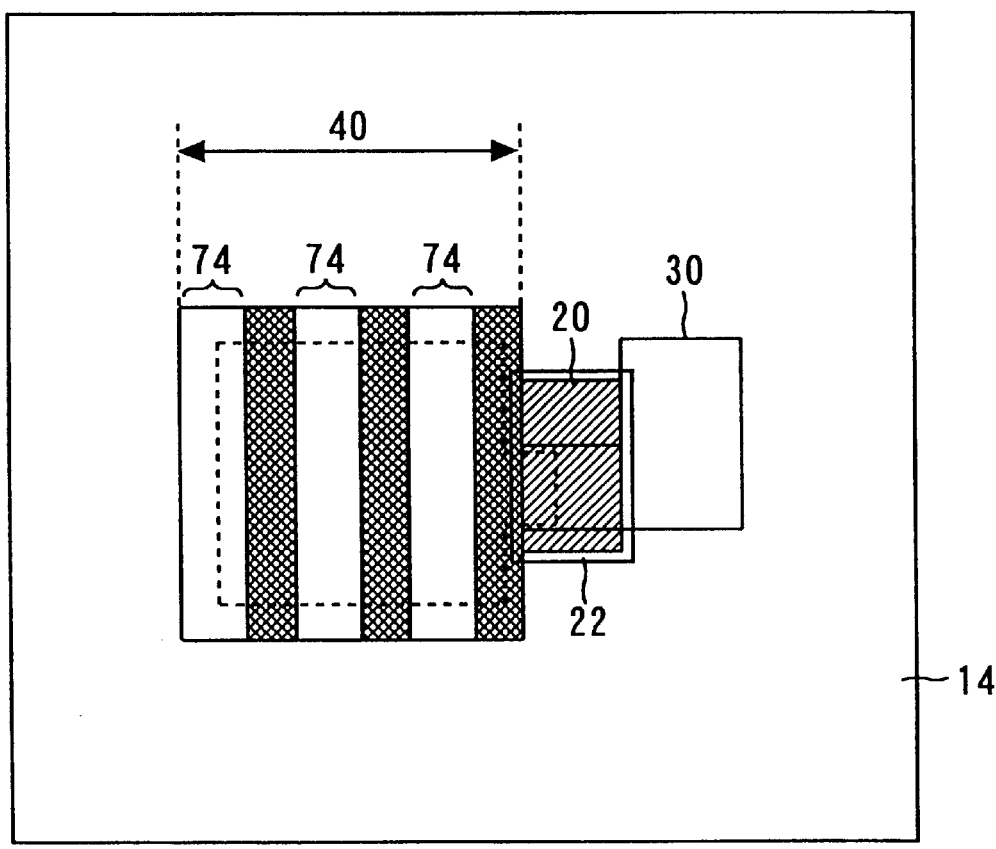
FIG. 19B is a plan view of the semiconductor device as the ninth embodiment.

A ninth embodiment of the present invention will now be described with reference to FIGS. 19A through 21C. FIG. 19A is a cross-sectional view of a semiconductor device practiced as the ninth embodiment. FIG. 19B is a plan view of the semiconductor device as the ninth embodiment. This semiconductor device comprises a plurality of concave portions 74 in the diode region 40. The ninth embodiment is similar in structure to the first embodiment except that the concave portions 74 are spaced a predetermined distance away from the gate electrode 20.

As with the first embodiment, the ninth embodiment in the structure outlined above ensures a sufficient light-gathering capability of the diode region 40, allocates a sufficiently wide effective area for the PN junction plane 48, and stabilizes the resulting semiconductor device in electrical characteristics.

An inventive method of manufacturing the semiconductor device as the ninth embodiment will now be described with reference to FIGS. 20A through 21C.

Figure 20A:
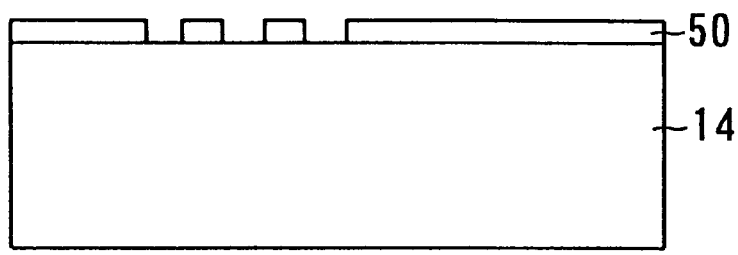
FIGS. 20A to 20E and FIGS. 21A to 21C are cross-sectional views for describing a manufacturing method of the semiconductor device as the ninth embodiment.

For the manufacture of the semiconductor device as the ninth embodiment, a protective film 50 is initially formed over the P-type substrate 14. Openings are patterned on the protective film 50 at positions where the concave portions 74 are to be formed (FIG. 20A).

Figure 20B:
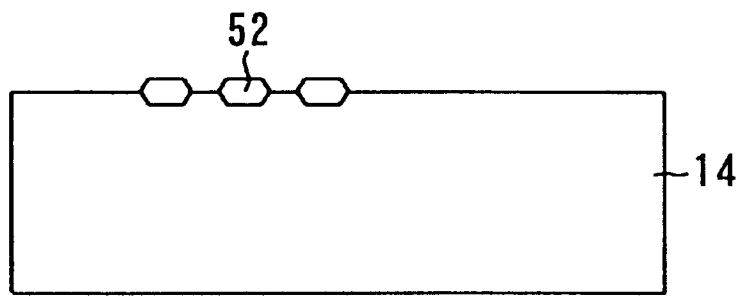

Performing field oxidation all over the P-type substrate 14 forms an oxide layer 52 at the positions where the concave portions 74 are to be produced. With the oxide layer 52 thus formed, the protective film 50 is removed from the surface of the P-type substrate 14 (FIG. 20B).

Figure 20C:
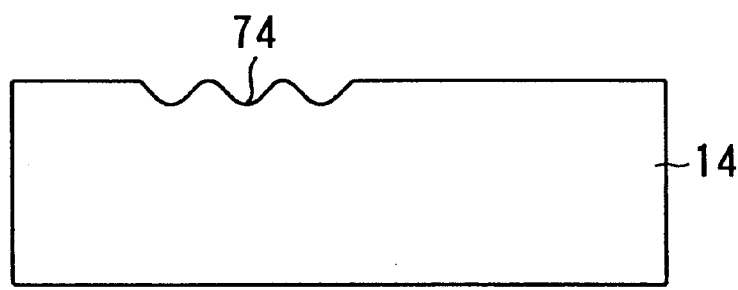

Wet etching is carried out to remove the oxide layer 52. This leaves a plurality of groove-like concave portions 74 formed on the surface of the P-type substrate 14 (FIG. 20C).

Figure 20D:
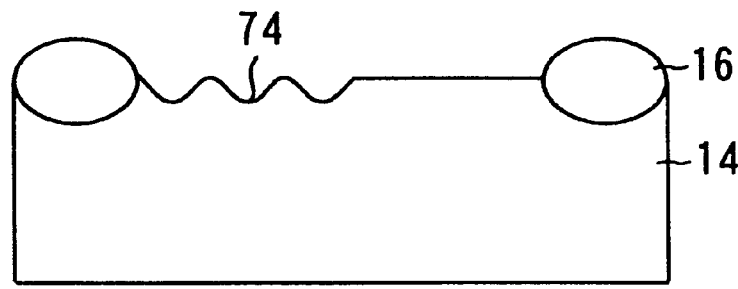

In the same steps as those carried out to form the oxide layer 52, an isolation oxide film 16 is furnished so as to divide the P-type substrate 14 into single-pixel regions (FIG. 20D).

Figure 20E:
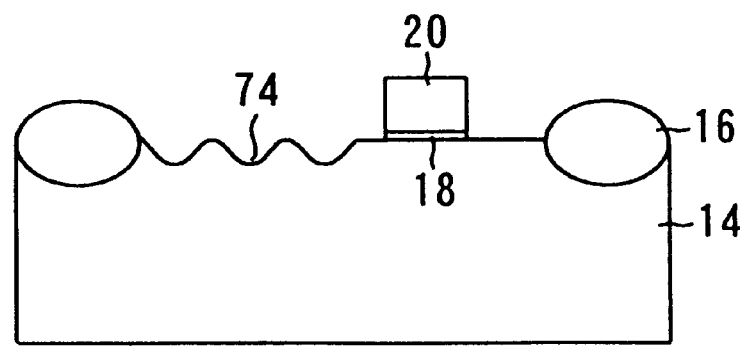
Figure 21A:
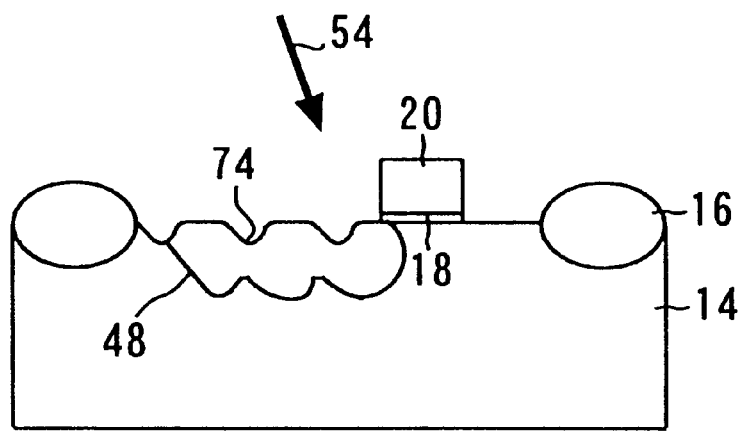
Figure 21B:
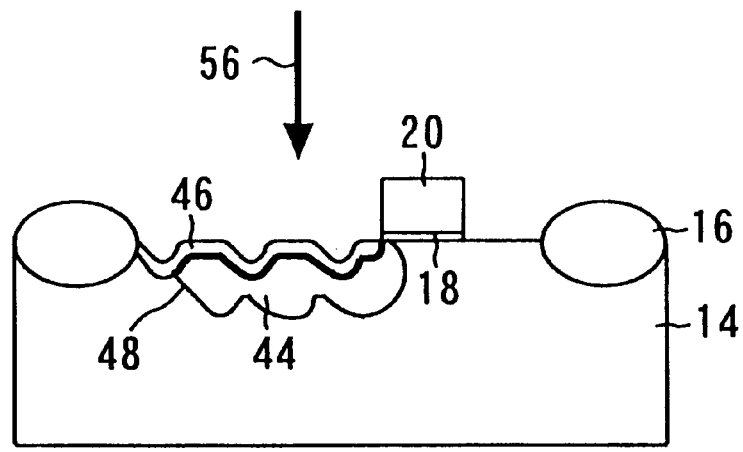
Figure 21C:
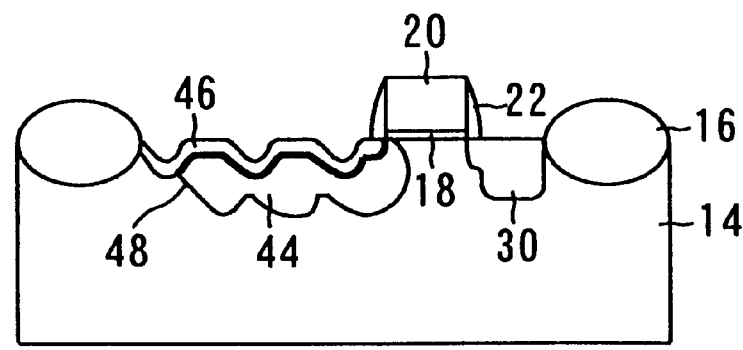

The gate oxide film 18 and gate electrode 20 are formed so that they are at a predetermined distance away from the closest of a plurality of concave portions 74 contained in the diode region 40 (FIG. 20E).

Thereafter, the same steps as those used for the first embodiment are carried out to manufacture the semiconductor device as the ninth embodiment (see FIGS. 3A through 3C and 21A through 21C).

Tenth Embodiment

Figure 22:
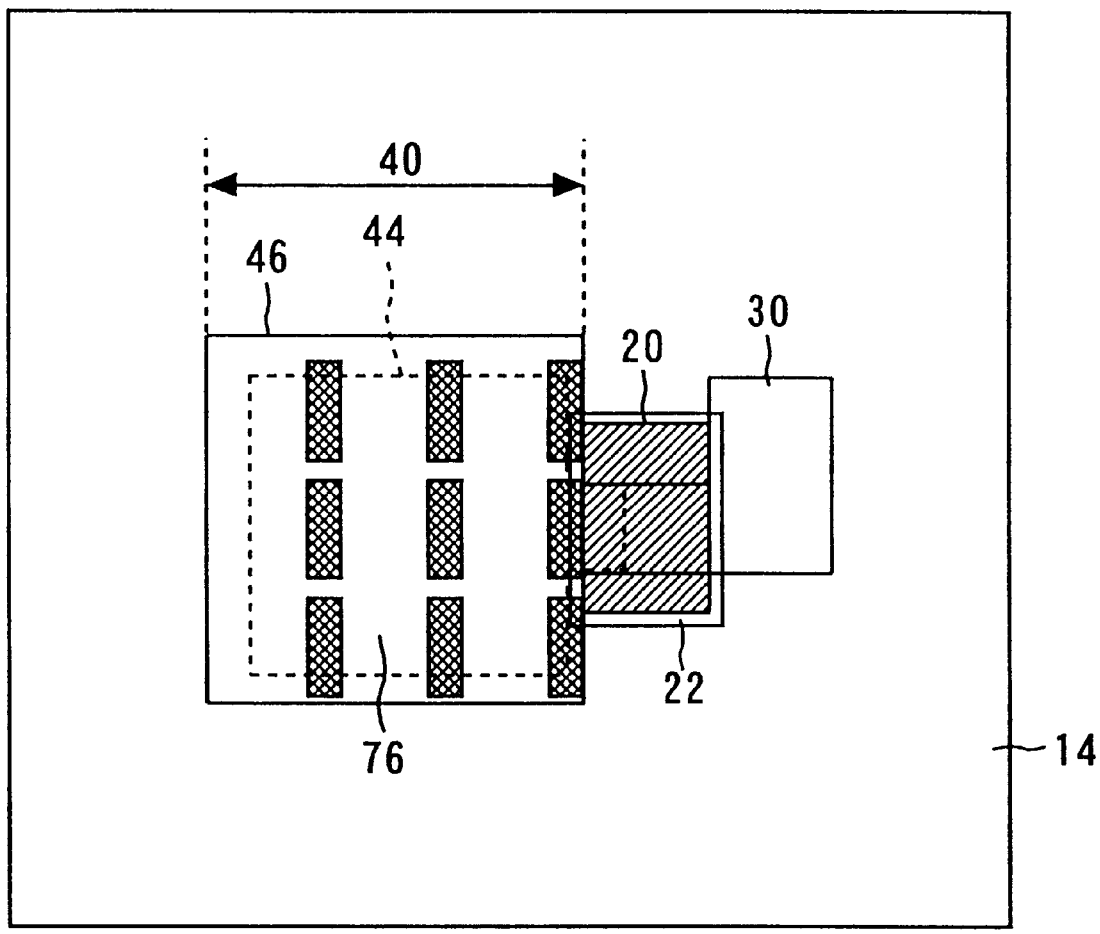
FIG. 22 is a plan view of a semiconductor device practiced as a tenth embodiment of the present invention.

A tenth embodiment of the present invention will now be described with reference to FIG. 22. FIG. 22 is a plan view of a semiconductor device practiced as the tenth embodiment. As in the case of FIG. 19B for the ninth embodiment, FIG. 22 shows a typical structure corresponding to a single pixel. The semiconductor device as the tenth embodiment is similar in structure to the ninth embodiment except that the tenth embodiment has a grid-like concave portion 76 in the diode region 40.

The tenth embodiment provides finer convex and concave portions in the diode region 40 than the ninth embodiment. Accordingly, the tenth embodiment makes it possible to further improve the light-gathering ability of the diode region 40 as well as further enlarge the effective area of the PN junction plane 48 compared with those in the ninth embodiment. Thus the semiconductor device as the tenth embodiment affords a degree of integration and a level of resolution equivalent to or higher than those of the ninth embodiment.

The inventive semiconductor device and the inventive method of manufacturing the same, as embodied and broadly described above, offer the following major effects:

According to the first aspect of the present invention, a PN diode functioning as a photo-transistor is implemented by a first and a second conduction type region. Over a first conduction type substrate, a control transistor is formed whose source is a partially submerged portion in the second conduction type region, whose drain is a second conduction type drain region, and whose channel is a portion covered with a gate oxide film. Because a concave portion is provided in contiguous relation to each gate electrode, it is easy precisely to adjust the concentration of impurities to be implanted into the submerged portion in the second conduction type region.

According to the second aspect of the present invention, an adequate carrier transfer capability is ensured between each PN junction diode and the corresponding control transistor. This effectively prevents the incidence of what is known as afterimage, a phenomenon conventionally experienced when a light signal carrier generated by the PN junction diode is not properly transferred.

According to the third aspect of the present invention, a plurality of concave portions may be furnished in the diode region. With this structure, each PN diode is highly sensitive because each of the multiple concave portions provides an excellent light-gathering capability based on the concave lens effect. Since the individual concave portions are not very deep, no appreciable differences in elevation occur in the diode region. This makes it possible precisely to control the concentration of impurities to be implanted into the first and the second conduction type region. Thus the invention provides a semiconductor device stabilized in electrical characteristics.

According to the fourth aspect of the present invention, a concave portion formed in the diode region affords an improved light-gathering capability based on the concave lens effect. The concave portion is formed in such a manner that no appreciable differences in elevation occur in the diode region. This also makes it possible precisely to control the concentration of impurities to be implanted into the first and the second conduction type region. The invention thus provides a semiconductor device stabilized in electrical characteristics.

According to the fifth aspect of the present invention, the PN junction plane formed in a border between the first and the second conduction type region may be rendered uneven. This structure increases the effective area of the PN junction plane. Since the PN junction diode proves to be more sensitive the wider the effective area of the PN junction plane, the invention provides a PN junction diode that is small and highly sensitive.

According to the sixth aspect of the present invention, an oxide layer may be formed at certain parts of a first conduction type substrate. The oxide layer may be subsequently removed so as to form concave portions. This makes it possible to minimize any damage that may be sustained by the first conduction type substrate during the etching process for concave formation. The method effectively suppresses the incidence of defects attributable to faulty crystals.

According to the seventh aspect of the present invention, concave portions may be formed by directly etching the first conduction type substrate. This method allows the concave portions to be formed more accurately in dimensions than the method for producing concave portions by removing the oxide layer from the first conduction type substrate. It is thus possible to manufacture a semiconductor device of a high degree of integration by following simplified production steps.

Further, the present invention is not limited to these embodiments, but variations and modifications may be made without departing from the scope of the present invention.

The entire disclosure of Japanese Patent Application No. Hei 11-180440 filed on Jun. 25, 1999 including specification, claims, drawings and summary are incorporated herein by reference in its entirety.

What is claimed is:

1. A semiconductor device including a PN junction diode and a control transistor, said PN junction diode functioning as a photo diode and comprising a semiconductor having a first conduction type, that is one of a P- or an N-type and another semiconductor of a second conduction type, that is the other of the two types, said control transistor controlling transfer of a light signal carrier generated within said PN junction diode, said semiconductor device comprising:

a first conduction type substrate having a first conduction type;

a gate oxide film and a gate electrode furnished on a surface of said first conduction type substrate;

at least one concave portion in a region of said first conduction type substrate, said region being contiguous to said gate electrode, said concave portion including said PN junction diode comprising a second conductivity type region partially underneath said gate oxide film and in said first conduction type substrate and a first conductivity type region covering said second conductivity type region; and a drain region having a second conduction type disposed on the opposite side of said gate electrode from said concave portion.

2. The semiconductor device according to claim 1, wherein said second conduction type region provides the submerged portion underneath said gate oxide film with a sufficient carrier transfer capability for transferring said light signal carrier generated by said PN junction diode.

3. The semiconductor device according to claim 1, wherein a plurality of concave portions are provided where said first conduction type region is formed.

4. The semiconductor device according to claim 1, wherein said first conduction type substrate has a single concave portion disposed in contiguous relation to said gate electrode where said first conduction type region is formed; and wherein said single concave portion comprises side walls and a flat portion, said side walls having a predetermined tilt angle with respect to said surface of said first conduction type substrate, said flat portion being substantially in parallel with said surface of said first conduction type substrate.

5. A semiconductor device including a PN junction diode and a control transistor, said PN junction diode functioning as a photo diode and comprising a semiconductor of a first conduction type that is one of a P- and an N-type and another semiconductor of a second conduction type that is the other of the two types, said control transistor controlling transfer of a light signal carrier generated within said PN junction diode, said semiconductor device comprising:

- a first conduction type substrate adjusted for said first conduction type;
- a gate oxide film and a gate electrode furnished on a surface of said first conduction type substrate;
- a concave portion provided on said first conduction type substrate;
- a second conduction type drain region disposed on the opposite side of said gate electrode from said concave portion;
- a second conduction type region which includes a region underneath said concave portion and which is provided in said first conduction type substrate in a partially submerged manner underneath said gate oxide film; and
- a first conduction type region which includes a region underneath said concave portion and which is provided on said first conduction type substrate so as to cover said second conduction type region, said first conduction type region and said second conduction type region together constituting said PN junction diode;
- wherein the region at where said first conduction type region is formed is provided a plurality of said concave portions.

6. The semiconductor device according to claim 1, wherein said PN junction plane formed in a border between said first conduction type substrate and said second conduction type region is formed in an uneven manner following the concave portions formed over said first conduction type substrate.

7. The semiconductor device according to claim 2, wherein said PN junction plane formed in a border between said first conduction type substrate and said second conduction type region is formed in an uneven manner following the concave portions formed over said first conduction type substrate.

8. The semiconductor device according to claim 3, wherein said PN junction plane formed in a border between said first conduction type substrate and said second conduction type region is formed in an uneven manner following the concave portions formed over said first conduction type substrate.

9. The semiconductor device according to claim 4, wherein said PN junction plane formed in a border between said first conduction type substrate and said second conduction type region is formed in an uneven manner following the concave portions formed over said first conduction type substrate.

10. The semiconductor device according to claim 5, wherein said PN junction plane formed in a border between said first conduction type substrate and said second conduction type region is formed in an uneven manner following the concave portions formed over said first conduction type substrate.

* * * * *